(12) United States Patent
Shin et al.

(10) Patent No.: US 11,869,873 B2
(45) Date of Patent: Jan. 9, 2024

(54) TILED DISPLAY DEVICE

(71) Applicant: Samsung Display Co., Ltd., Yongin-si (KR)

(72) Inventors: Dong Hee Shin, Asan-si (KR); Sun Kwun Son, Suwon-si (KR); Na Hyeon Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 316 days.

(21) Appl. No.: 17/445,135

(22) Filed: Aug. 16, 2021

(65) Prior Publication Data
US 2022/0077111 A1 Mar. 10, 2022

(30) Foreign Application Priority Data

Sep. 10, 2020 (KR) .................. 10-2020-0115935

(51) Int. Cl.
*H01L 25/065* (2023.01)
*H01L 25/16* (2023.01)
*H01L 25/18* (2023.01)
*H01L 27/12* (2006.01)
*H10K 59/131* (2023.01)
*H01L 23/00* (2006.01)

(52) U.S. Cl.
CPC ........ *H01L 25/0655* (2013.01); *H01L 25/162* (2013.01); *H01L 25/18* (2013.01); *H01L 27/124* (2013.01); *H10K 59/131* (2023.02); *H01L 24/32* (2013.01); *H01L 25/167* (2013.01); *H01L 2224/32137* (2013.01)

(58) Field of Classification Search
CPC ... H01L 25/0655; H01L 25/162; H01L 25/18; H01L 27/124; H01L 24/32; H01L 25/167; H01L 2224/32137; H10K 59/131; H10K 59/18; G09F 9/33; G09G 3/3266; G09G 3/3291; G09G 2340/0407
See application file for complete search history.

(56) References Cited

U.S. PATENT DOCUMENTS

2020/0357362 A1* 11/2020 Shin ...................... G09G 3/035

FOREIGN PATENT DOCUMENTS

KR 10-2016-0013470 A 2/2016

* cited by examiner

*Primary Examiner* — Kyoung Lee
(74) *Attorney, Agent, or Firm* — Lewis Roca Rothgerber Christie LLP

(57) ABSTRACT

Provided is a tiled display device. The tiled display device includes adjacent first and second display devices including a display area having pixels, a bonding area between the display areas of the first and second display devices, data lines extending in a first direction, first gate lines extending in the first direction, and configured to transmit a gate signal, and off voltage lines extending in the first direction, and configured to transmit an off voltage, wherein one of the off voltage lines is between a first pixel at an outermost side of the first display device and a second pixel located more inwardly than first pixel, and wherein the off voltage lines are not between a third pixel at an outermost side of the second display device and the first pixel.

20 Claims, 13 Drawing Sheets

CST: CE1, CE2

TILED DISPLAY DEVICE

CROSS-REFERENCE TO RELATED APPLICATION

This application claims priority to, and the benefit of, Korean Patent Application No. 10-2020-0115935 filed on Sep. 10, 2020 in the Korean Intellectual Property Office, the contents of which are herein incorporated by reference.

BACKGROUND

1. Field

The present disclosure relates to a tiled display device.

2. Description of the Related Art

With the advance of information-oriented society, more and more demands are placed on display devices for displaying images in various ways. For example, display devices are employed in various electronic devices, such as smartphones, digital cameras, laptop computers, navigation devices, and smart televisions. The display device may be a flat panel display device, such as a liquid crystal display device, a field emission display device, and an organic light emitting display device. Among the flat panel display devices, in the light emitting display device, because each of pixels of a display panel includes a light emitting element capable of emitting light by itself, an image can be displayed without a backlight unit for providing light to the display panel.

When the display device is manufactured in a large size, a defect rate of the light emitting element may increase due to an increase in the number of pixels, thereby deteriorating productivity or reliability of the display device. To solve this problem, in a tiled display device, a large-sized screen may be implemented by connecting a plurality of display devices having a relatively small size. The tiled display device may include a boundary portion, which may be called a seam, between the plurality of display devices due to a non-display area or a bezel area of each of the plurality of display devices that are adjacent to each other. When a single image is displayed on the entire screen, the boundary portion between the plurality of display devices gives a sense of disconnection over the screen, thereby reducing a sense of immersion in the image.

SUMMARY

Aspects of the present disclosure provide a tiled display device capable of removing a sense of disconnection between a plurality of display devices, and capable of improving a sense of immersion in an image, by reducing or preventing the recognition of boundary portions or non-display areas between the plurality of display devices.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to some embodiments of the present disclosure, a tiled display device includes adjacent first and second display devices including a display area having pixels, a bonding area between the display areas of the first and second display devices, data lines extending in a first direction, first gate lines extending in the first direction, and configured to transmit a gate signal, and off voltage lines extending in the first direction, and configured to transmit an off voltage, wherein one of the off voltage lines is between a first pixel at an outermost side of the first display device and a second pixel located more inwardly than first pixel, and wherein the off voltage lines are not between a third pixel at an outermost side of the second display device and the first pixel.

The bonding area may be between the first pixel and the third pixel.

One of the data lines may be between the first pixel and the bonding area.

The display area may include a vertical gate area in which the first gate lines are located, and off voltage areas on respective sides of the vertical gate area, and in which the off voltage lines are located.

Each of the first and second display devices may further include second gate lines extending in a second direction crossing the first direction, wherein the vertical gate area includes line contact portions to which respective ones of the first gate lines and the second gate lines are connected.

Each of the first and second display devices may further include a first auxiliary gate line extending in a direction opposite to the first direction from the second gate lines, wherein the first auxiliary gate line of the first display device is between the first pixel and one of the data lines adjacent to the first pixel in the second direction, and wherein the first auxiliary gate line of the second display device is between the third pixel and one of the data lines adjacent to the third pixel in the second direction.

Each of the first and second display devices may further include a second auxiliary gate line extending in a direction opposite to the first direction from a respective one of the second gate lines, and located between a high potential line configured to transmit a high potential voltage, and a sensing line connected to the first pixel or to the third pixel.

One of the first gate lines may be between one of the data lines connected to a fourth pixel in the vertical gate area, and a high potential line configured to transmit a high potential voltage and connected to a fifth pixel adjacent to the fourth pixel.

The first and second display devices may include a flexible film in a non-display area on one side of the display area, and a display driver on the flexible film.

One side of the display area facing the flexible film may be either perpendicular to, or opposite to, another side of the display area facing the bonding area.

The display driver may include a data driver configured to supply a data voltage to the data lines, a gate driver configured to supply a gate signal to the first gate lines, and an off voltage supply unit configured to supply an off voltage to the off voltage lines.

The first and second display devices may further include a high potential line extending in the first direction, and configured to transmit a high potential voltage, a low potential line extending in the first direction, and configured to transmit a low potential voltage, and a sensing line extending in the first direction and connected to one of the pixels.

At least one of the high potential line, the low potential line, and the sensing line may be between the bonding area and the third pixel.

The first and third pixels may include a first sub-pixel, a second sub-pixel adjacent to the first sub-pixel in the first direction, and a third sub-pixel adjacent to the second sub-pixel in the first direction.

The data lines may include a first data line adjacent to the first to third sub-pixels in a second direction crossing the first direction, and connected to the first sub-pixel, a second data line adjacent to the first data line in the second direction, and connected to the second sub-pixel, and a third data line adjacent to the second data line in the second direction, and connected to the third sub-pixel.

The high potential line may be adjacent to the first to third sub-pixels in a direction opposite to the second direction, wherein the sensing line is adjacent to the high potential line in the direction opposite to the second direction, and wherein the low potential line is adjacent to the sensing line in the direction opposite to the second direction.

The third data line of the first pixel may directly face the bonding area.

The low potential line may be located in a direction opposite to the second direction from the third pixel, and directly faces a side of the display area that is opposite to the bonding area.

According to some embodiments of the present disclosure, a tiled display device includes a first display device including a first display area having pixels, a second display device on one side of the first display device and including a second display area having pixels, and a bonding area between the first display area and the second display area, wherein each of the first and second display devices includes a data line extending in a first direction, and adjacent to one of the pixels in a second direction crossing the first direction, and a low potential line extending in the first direction, and adjacent to the one of the pixels in a direction that is opposite to the second direction, wherein the first display device includes a first pixel of the pixels that is closest to the bonding area, and an off voltage line extending in the first direction and located in a direction opposite to the second direction from the first pixel, and wherein the second display device includes a second pixel of the pixels that is closest to the bonding area, and the low potential line, which is located in a direction that is opposite to the second direction from the second pixel, and which directly faces the bonding area.

The data line, which is located in the second direction from the first pixel, may directly face a side of the first display area that is opposite to the bonding area.

In the tiled display device according to embodiments, the distance between a pixel located at the outermost side of a first display device, and a pixel located at the outermost side of a second display device, may be made substantially the same as the distance between pixels within the display devices due to not providing a vertical gate line or an off voltage line between the pixel located at the outermost side of the first display device and the pixel located at the outermost side of the second display device. The distance between the plurality of display devices may be so close that a bonding area is not recognized by a user. Accordingly, in the tiled display device TD, recognition of the bonding area SM by a user may be reduced or prevented, thereby removing a sense of disconnection between the plurality of display devices, and thereby improving a sense of immersion in the image.

It should be noted that the aspects of the present disclosure are not limited to those described above, and other aspects of the present disclosure will be apparent from the following description.

BRIEF DESCRIPTION OF THE DRAWINGS

The above and other aspects of the present disclosure will become more apparent by describing in detail embodiments thereof with reference to the attached drawings, in which.

DETAILED DESCRIPTION

Figure 1:
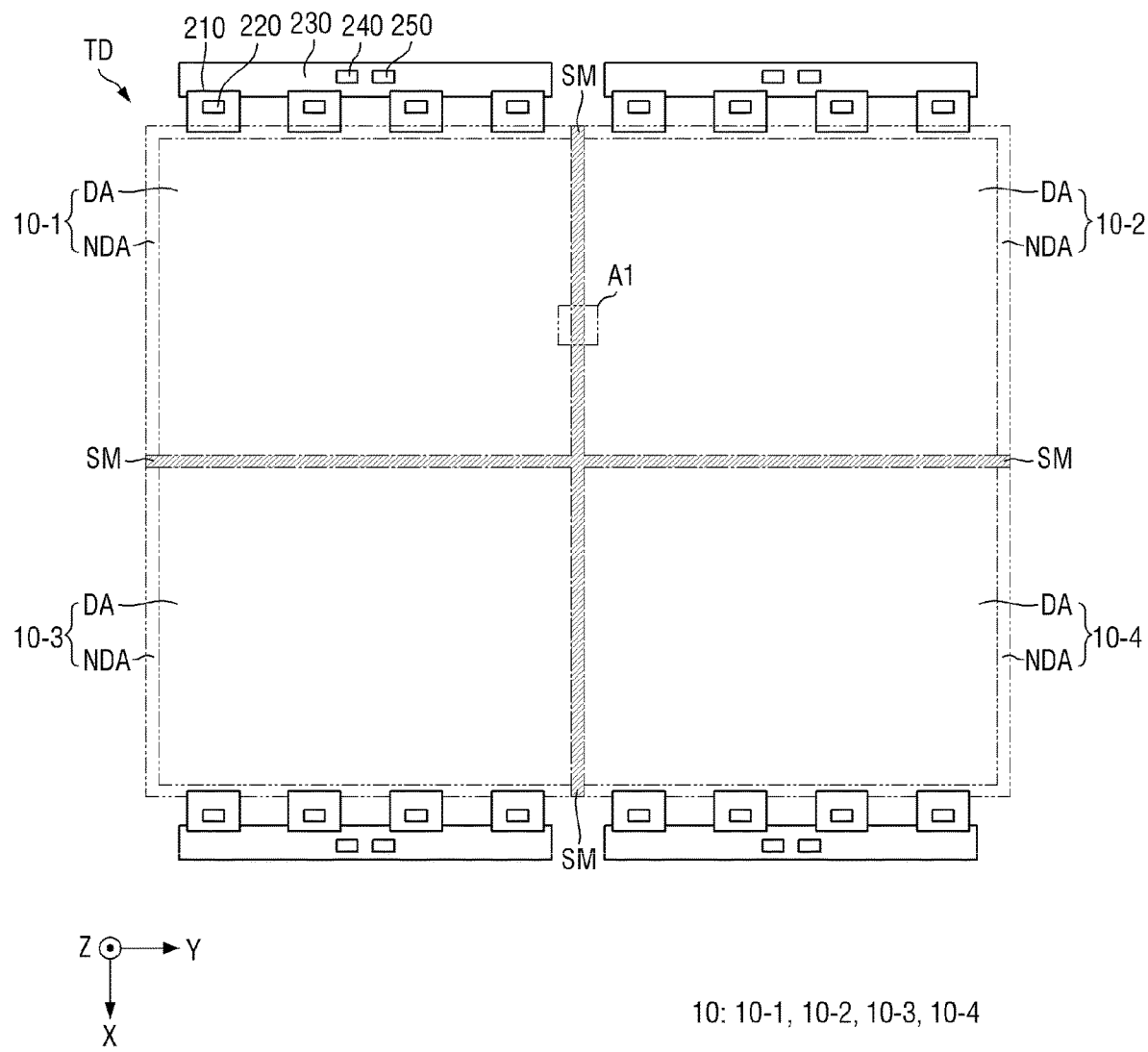
FIG. 1 is a plan view illustrating a tiled display device according to some embodiments.

In the following description, for the purposes of explanation, numerous specific details are set forth to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of some embodiments may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When some embodiments may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

Further, in this specification, the phrase "on a plane," or "plan view," means viewing a target portion from the top, and the phrase "on a cross-section" means viewing a cross-section formed by vertically cutting a target portion from the side.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
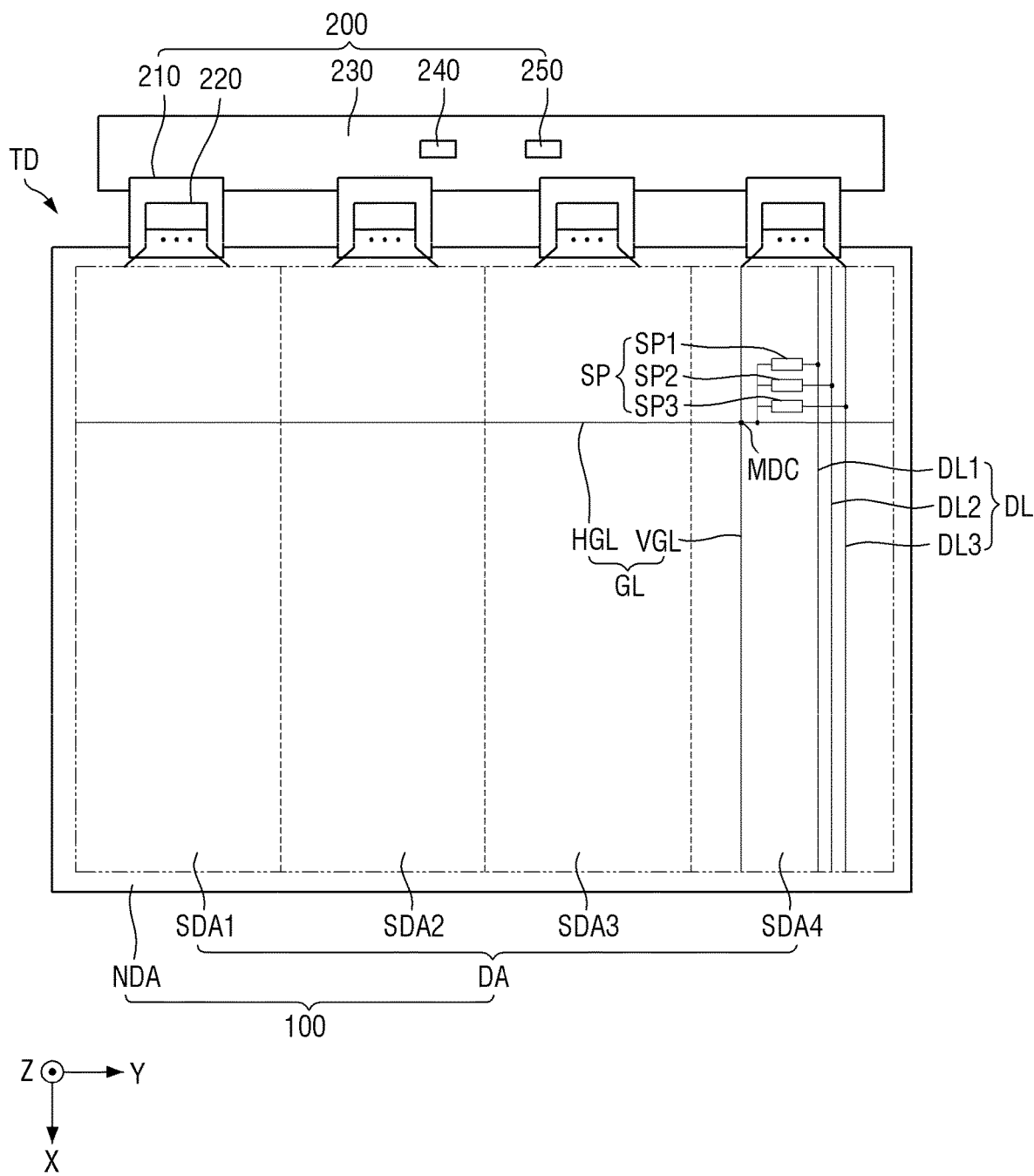
FIG. 2 is a plan view illustrating a display device of a tiled display device according to some embodiments.

FIG. 1 is a plan view illustrating a tiled display device according to some embodiments. FIG. 2 is a plan view illustrating a display device of a tiled display device according to some embodiments.

Referring to FIGS. 1 and 2, a tiled display device TD may include a plurality of display devices 10. The plurality of display devices 10 may be arranged in a grid form, but the present disclosure is not limited thereto. The plurality of display devices may be connected in a first direction (X-axis direction) or a second direction (Y-axis direction), and the tiled display device TD may have a given shape. For example, the plurality of display devices 10 may have the same size, but the present disclosure is not limited thereto. As another example, the plurality of display devices 10 may have different sizes.

The tiled display device TD may include first to fourth display devices 10-1 to 10-4. The number and connection relationship of the display devices 10 are not limited to FIG. 1. The number of the display devices 10 may be determined according to the size of each of the display devices 10 and the size of the tiled display device TD.

Each of the plurality of display devices 10 may have a rectangular shape including long sides and short sides. The plurality of display devices 10 may be arranged such that the long sides or the short sides thereof are connected to each other. Some of the display devices 10 may be located at the edge of the tiled display device TD to form one side of the tiled display device TD. Some others of the display devices 10 may be located at corners of the tiled display device TD to form two adjacent sides, or portions thereof, of the tiled display device TD. Yet some others of the display devices 10 may be located on the inner side of the tiled display device TD, and may be surrounded by other display devices 10.

The tiled display device TD may have a planar shape as a whole, but the present disclosure is not limited thereto. The tiled display device TD may have a three-dimensional shape to provide a three-dimensional effect to a user. For example, when the tiled display device TD has a three-dimensional shape, at least some of the plurality of display devices 10 may have a curved shape. As another example, the plurality of display devices 10 may each have a planar shape, and may be connected to each other at an angle (e.g., a predetermined angle), so that the tiled display device TD may have a three-dimensional shape.

The tiled display device TD may include a bonding area SM located between a plurality of display areas DA. The tiled display device TD may be formed by connecting non-display areas NDA of the adjacent display devices 10. The plurality of display devices 10 may be connected to each other through a bonding member or through an adhesive member located in the bonding area SM. The bonding area SM of each of the plurality of display devices 10 may omit a pad portion and a flexible film attached to the pad portion. Accordingly, the distance between the display areas DA of the plurality of display devices 10 may be sufficiently close that the bonding area SM between the plurality of display devices 10 is not recognized by the user.

For example, the distance between a pixel SP located at the outermost right side of the first display device 10-1 and a pixel SP located at the outermost left side of the second display device 10-2 may be substantially the same as the distance between pixels SP within each of the plurality of display devices 10, although the present disclosure is not limited thereto. In addition, the reflectance of external light of the display areas DA of the plurality of display devices 10 may be substantially the same as that of the bonding area SM between the plurality of display devices 10. Accordingly, in the tiled display device TD, recognition by a user of the bonding area SM between the plurality of display devices 10 may be reduced or prevented, thereby removing a sense of disconnection between the plurality of display devices 10 and thereby improving a sense of immersion in an image.

The display device 10 may include a display panel 100, a flexible film 210, a display driver 220, a circuit board 230, a timing controller 240, and a power supply unit 250.

The display panel 100 may include a display area DA and a non-display area NDA. The display area DA may include a plurality of pixels SP arranged along the first direction (X-axis direction) and the second direction (Y-axis direction) to display an image. Each of the plurality of pixels SP may include an emission area defined by a pixel definition layer or a bank, and may emit light having a peak wavelength (e.g., a predetermined peak wavelength) through the emission area.

For example, the display area DA may include first to fourth sub-display areas SDA1, SDA2, SDA3, and SDA4, and the display device 10 may include four flexible films 210 and four display drivers 220. One flexible film 210 and one display driver 220 may correspond to each of the first to fourth sub-display areas SDA1, SDA2, SDA3, and SDA4. The first to fourth sub-display areas SDA1, SDA2, SDA3, and SDA4 may be arranged along the second direction (Y-axis direction), but the present disclosure is not limited thereto.

The non-display area NDA may be located around the display area DA to surround the display area DA, and might not display an image. For example, the non-display area NDA may include fan-out lines connecting the data lines DL or the vertical gate lines VGL to the display driver 220, and a pad portion connected to the flexible film 210.

Each of the plurality of pixels SP may include first to third sub-pixels SP1, SP2, and SP3. The pixel SP may be a unit pixel including the first to third sub-pixels SP1, SP2, and SP3. The first to third sub-pixels SP1, SP2, and SP3 may be sequentially and repeatedly arranged along the first direction (X-axis direction) in the display area DA. For example, the first sub-pixel SP1 may emit light of a first color, the second sub-pixel SP2 may emit light of a second color, and the third sub-pixel SP3 may emit light of a third color, but they are not limited thereto. The first color light may be red light having a peak wavelength in the range from about 610 nm to about 650 nm, the second color light may be green light having a peak wavelength in the range from about 510 nm to about 550 nm, and the third color light may be blue light having a peak wavelength in the range from about 440 nm to about 480 nm, but the present disclosure is not limited thereto.

The display area DA of the display panel 100 may include a plurality of gate lines GL and a plurality of data lines DL connected to the plurality of pixels SP. The plurality of gate lines GL may include a plurality of first gate lines VGL and a plurality of second gate lines HGL. For example, the plurality of first gate lines may be a plurality of vertical gate lines VGL connected to the display driver 220 and extending in the first direction (X-axis direction), and the plurality of second gate lines may be a plurality of horizontal gate lines HGL extending in the second direction (Y-axis direction). Each of the plurality of vertical gate lines VGL may be connected to one of the plurality of horizontal gate lines HGL through a line contact portion MDC. Each of the first to third sub-pixels SP1, SP2, and SP3 may be connected to one horizontal gate line HGL and one data line DL. Each of the first to third sub-pixels SP1, SP2, and SP3 may be defined as a minimum unit area that outputs light.

For example, one vertical gate line VGL may be connected to one horizontal gate line HGL. In this case, each of the plurality of pixels SP may receive a data voltage from the data line DL located at one side. As another example, one vertical gate line VGL may be connected to two horizontal gate lines HGL. In this case, pixels SP arranged in some rows among the plurality of pixels SP may receive data voltages from the data lines DL located on the left side, and pixels SP arranged in some other rows may receive data voltages from the data lines DL located on the right side. Accordingly, the connection relationship among the plurality of data lines DL, the plurality of vertical gate lines VGL, the plurality of horizontal gate lines HGL, and the plurality of pixels SP is not limited to that shown in FIG. 2. The connection relationship among the plurality of data lines DL, the plurality of vertical gate lines VGL, the plurality of horizontal gate lines HGL, and the plurality of pixels SP may be changed in design depending on the number and arrangement of the plurality of pixels SP.

The plurality of data lines DL may extend in the first direction (X-axis direction) and may be spaced apart from each other in the second direction (Y-axis direction). The plurality of data lines DL may include first to third data lines DL1, DL2, and DL3 connected to the first to third sub-pixels SP1, SP2, and SP3, respectively. The first to third data lines DL1, DL2, and DL3 may be located adjacent in the second direction (Y-axis direction) to the first to third sub-pixels SP1, SP2, and SP3 arranged along the first direction (X-axis direction). For example, the first to third data lines DL1, DL2, and DL3 may be sequentially located along the second direction (Y-axis direction), but the present disclosure is not limited thereto.

The flexible film 210 may be connected to the pad portion provided in the non-display area NDA of the display panel 100. Input terminals provided on one side of the flexible film 210 may be attached to the circuit board 230 by a film attaching process, and output terminals provided at the other side of the flexible film 210 may be attached to the pad portion of the display panel 100 by the film attaching process. For example, the flexible film 210 may be able to be bent, and may be, for example, a tape carrier package or a chip on film. The flexible film 210 may be bent toward the lower portion of the display panel 100 to reduce the non-display area NDA, or a bezel area, of the display device 10, but the present disclosure is not limited thereto.

One side of the display area DA facing the flexible film 210 may be perpendicular to, or opposite to, the other side of the display area DA facing the bonding area SM. Because the flexible film 210 is located on one side of the display area DA without being located in the bonding area SM, the width of the bonding area SM between the plurality of display devices 10 may be reduced.

The display driver 220 may be mounted on the flexible film 210. For example, the display driver 220 may be implemented as an integrated circuit (IC). The display driver 220 may receive digital video data and a data control signal from the timing controller 240, and based on the data control signal, may convert the digital video data to an analog data voltage to supply it to the data lines DL through the fan-out lines. In addition, the display driver 220 may generate a gate signal based on a gate control signal supplied from the timing controller 240, and sequentially supply the gate signal to the plurality of vertical gate lines VGL in a set order.

The circuit board 230 may support the timing controller 240 and the power supply unit 250, and may transmit a signal and power from the timing controller 240 and the power supply unit 250, respectively, to the flexible film 210 and the display driver 220. For example, the circuit board 230 may supply a signal supplied from the timing controller 240, and driving power supplied from the power supply unit 250, to the display driver 220 to display an image on the plurality of pixels SP. To this end, a signal transmission line and a plurality of power lines may be provided on the circuit board 230.

In some embodiments, the timing controller 240 may be mounted on the circuit board 230 and may receive image data and a timing synchronization signal supplied from a display driving system through a user connector provided on the circuit board 230. The timing controller 240 may generate digital video data by arranging the image data to fit the pixel arrangement structure based on the timing synchronization signal, and may supply the generated digital video data to the corresponding display driver 220. The timing controller 240 may generate the data control signal and the gate control signal based on the timing synchronization signal. The timing controller 240 may control the data voltage supply timing of the display driver 220 based on the data control signal, and may control the gate signal supply timing of the display driver 220 based on the gate control signal.

The power supply unit 250 may be located on the circuit board 230 to supply voltages to the display driver 220 and the display panel 100. For example, the power supply unit 250 may generate a driving voltage to supply it to a high potential line of the display panel 100, may generate a common voltage to supply it to a low potential line of the display panel 100, and may generate an off voltage to supply it to an off voltage line of the display panel 100. The driving voltage may be a high potential voltage that drives the plurality of pixels SP, the common voltage may be a low potential voltage that is commonly supplied to the plurality of pixels SP, and the off voltage may be a gate off voltage that can turn off a switching element or a switching transistor of the pixel SP.

Figure 3:
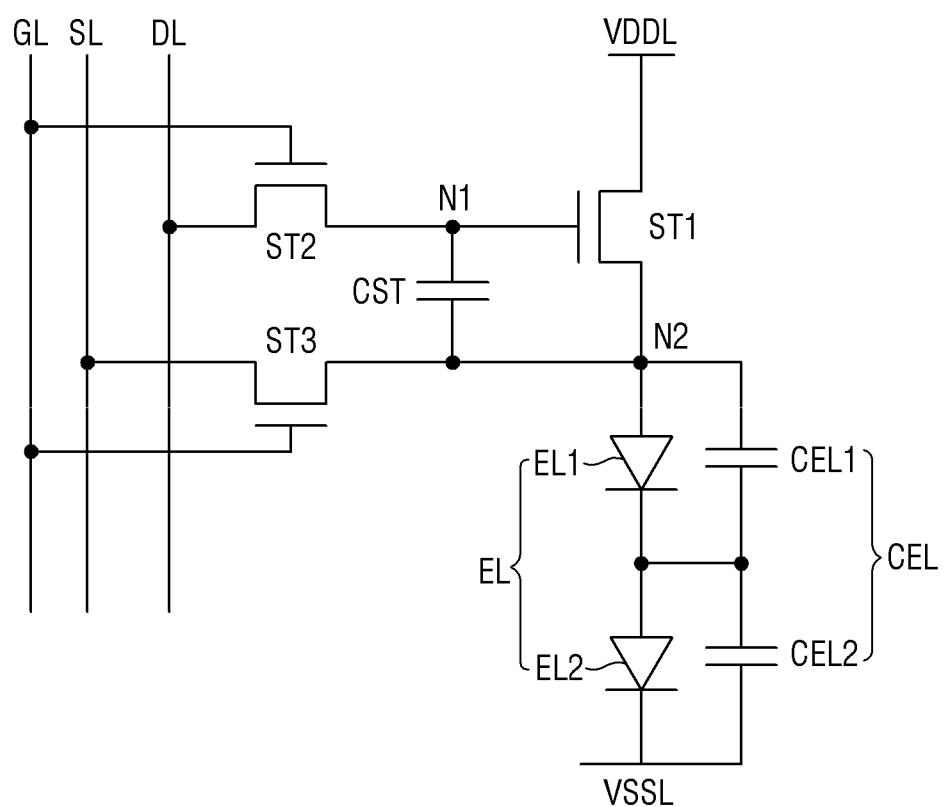
FIG. 3 is a circuit diagram illustrating a sub-pixel of a display device in a tiled display device according to some embodiments.

FIG. 3 is a circuit diagram illustrating a sub-pixel of a display device in a tiled display device according to some embodiments.

Referring to FIG. 3, each of the first to third sub-pixels SP1, SP2, and SP3 may include first to third switching elements ST1, ST2, and ST3, a storage capacitor CST, and a plurality of light emitting elements EL, and a plurality of light emitting capacitors CEL.

The first switching element ST1 may control a driving current supplied to the plurality of light emitting elements EL. The first switching element ST1 may supply a driving voltage to a second node N2 based on the voltage of a first node N1. The gate electrode of the first switching element ST1 may be connected to the first node N1. The gate electrode of the first switching element ST1 may be connected to the source electrode of the second switching element ST2 and the first electrode of the storage capacitor CST through the first node N1. The drain electrode of the first switching element ST1 may be connected to a high potential line VDDL. The drain electrode of the first switching element ST1 may receive the driving voltage from the high potential line VDDL. The source electrode of the first switching element ST1 may be connected to the second node N2. The source electrode of the first switching element ST1 may be connected to the source electrode of the third switching element ST3, the second electrode of the storage capacitor CST, the first electrode of a first light emitting element EL1, and the first electrode of a first light emitting capacitor CEL1 of the light emitting capacitors CEL through the second node N2.

The second switching element ST2 may supply a data voltage to the first node N1 based on a gate signal of the gate line GL. The gate electrode of the second switching element ST2 may be connected to the gate line GL to receive the gate signal. The drain electrode of the second switching element ST2 may be connected to the data line DL to receive the data voltage. The source electrode of the second switching element ST2 may be connected to the first node N1. The source electrode of the second switching element ST2 may be connected to the gate electrode of the first switching element ST1 and to the first electrode of the storage capacitor CST through the first node N1.

The third switching element ST3 may connect a sensing line SL to the second node N2 based on the gate signal of the gate line GL. The third switching element ST3 may supply an initialization voltage to the second node N2 or a voltage of the second node N2 to the sensing line SL. The gate electrode of the third switching element ST3 may be connected to the gate line GL to receive the gate signal. The drain electrode of the third switching element ST3 may be connected to the sensing line SL to receive the initialization voltage. The source electrode of the third switching element ST3 may be connected to the second node N2. The source electrode of the third switching element ST3 may be connected to the source electrode of the first switching element ST1, the second electrode of the storage capacitor CST, the first electrode of the first light emitting element EL1, and the first electrode of the first light emitting capacitor CEL1, through the second node N2.

The storage capacitor CST may be connected between the first node N1 that is the gate electrode of the first switching element ST1 and the second node N2 that is the source electrode of the first switching element ST1. For example, the first electrode of the storage capacitor CST is connected to the first node N1, and the second electrode of the storage capacitor CST is connected to the second node N2, so that a potential difference between the first node N1 and the second node N2 may be maintained.

The plurality of light emitting elements EL may emit light by receiving the driving current. The plurality of light emitting elements EL may include the first light emitting element EL1 and a second light emitting element EL2 connected in series. The first electrode of the first light emitting element EL1 may be connected to the second node N2, and the second electrode of the first light emitting element EL1 may be connected to the first electrode of the second light emitting element EL2. The first electrode of the second light emitting element EL2 may be connected to the second electrode of the first light emitting element EL1, and the second electrode of the second light emitting element EL2 may be connected to a low potential line VSSL. Here, the number and connection relationship of the plurality of light emitting elements EL are not limited to those shown in FIG. 3. The amount of light emission, or luminance, of the light emitting element EL may be proportional to the magnitude of the driving current. The light emitting element EL may include the first electrode, the second electrode, and a light emitting diode located between the first electrode and the second electrode. For example, the light emitting diode may be an organic light emitting diode, a micro light emitting diode (micro LED), a quantum dot light emitting diode, or an inorganic light emitting diode.

The plurality of light emitting capacitors CEL may include the first light emitting capacitor CEL1 and a second light emitting capacitor CEL2. The first and second light emitting capacitors CEL1 and CEL2 may be connected in parallel to the first and second light emitting elements EL1 and EL2, respectively. The first light emitting capacitor CEL1 may maintain a potential difference between the first and the second electrodes of the first light emitting element EL1, and the second light emitting capacitor CEL2 may maintain a potential difference between the first and the second electrodes of the second light emitting element EL2.

Figure 4:
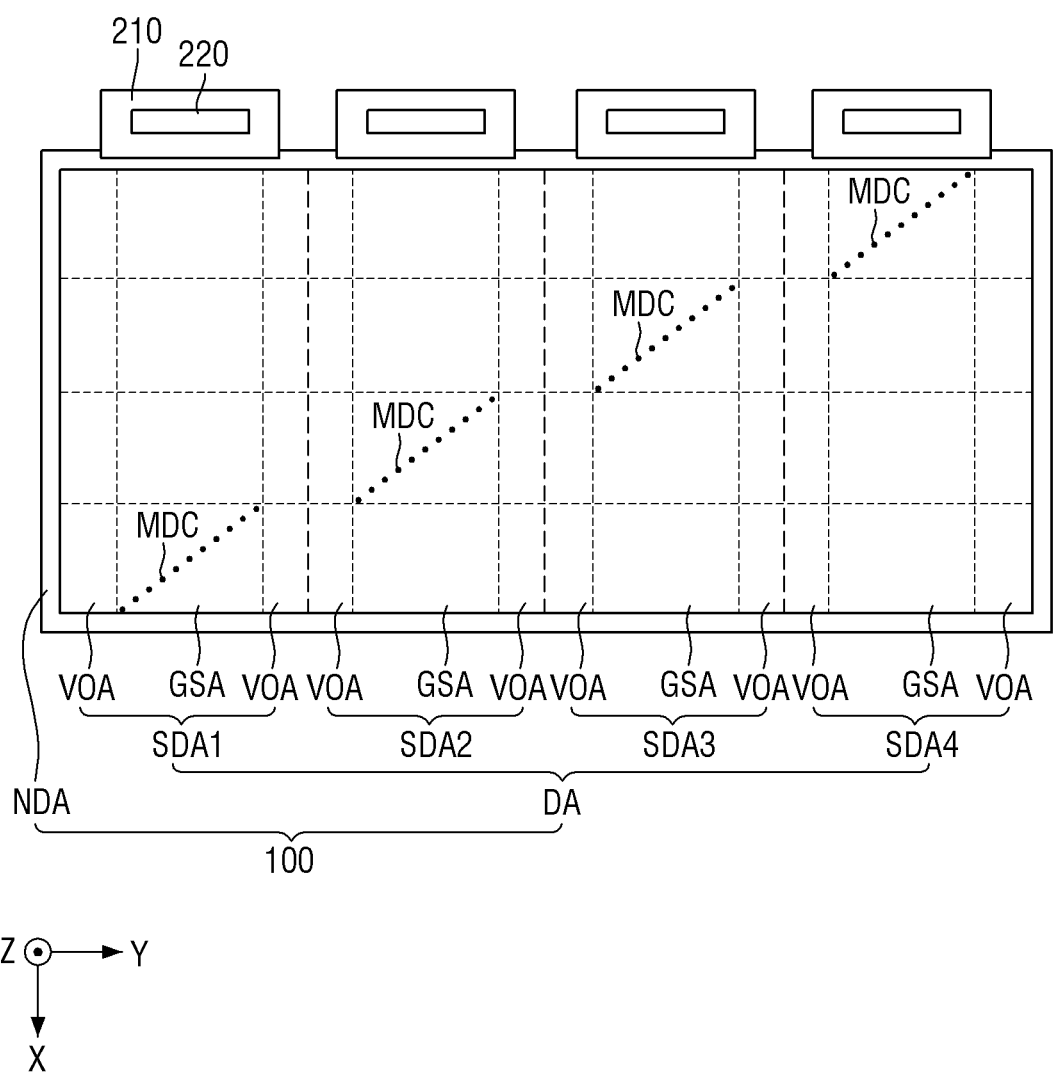
FIG. 4 is a plan view illustrating a vertical gate area and an off voltage area in a tiled display device according to some embodiments.
Figure 5:
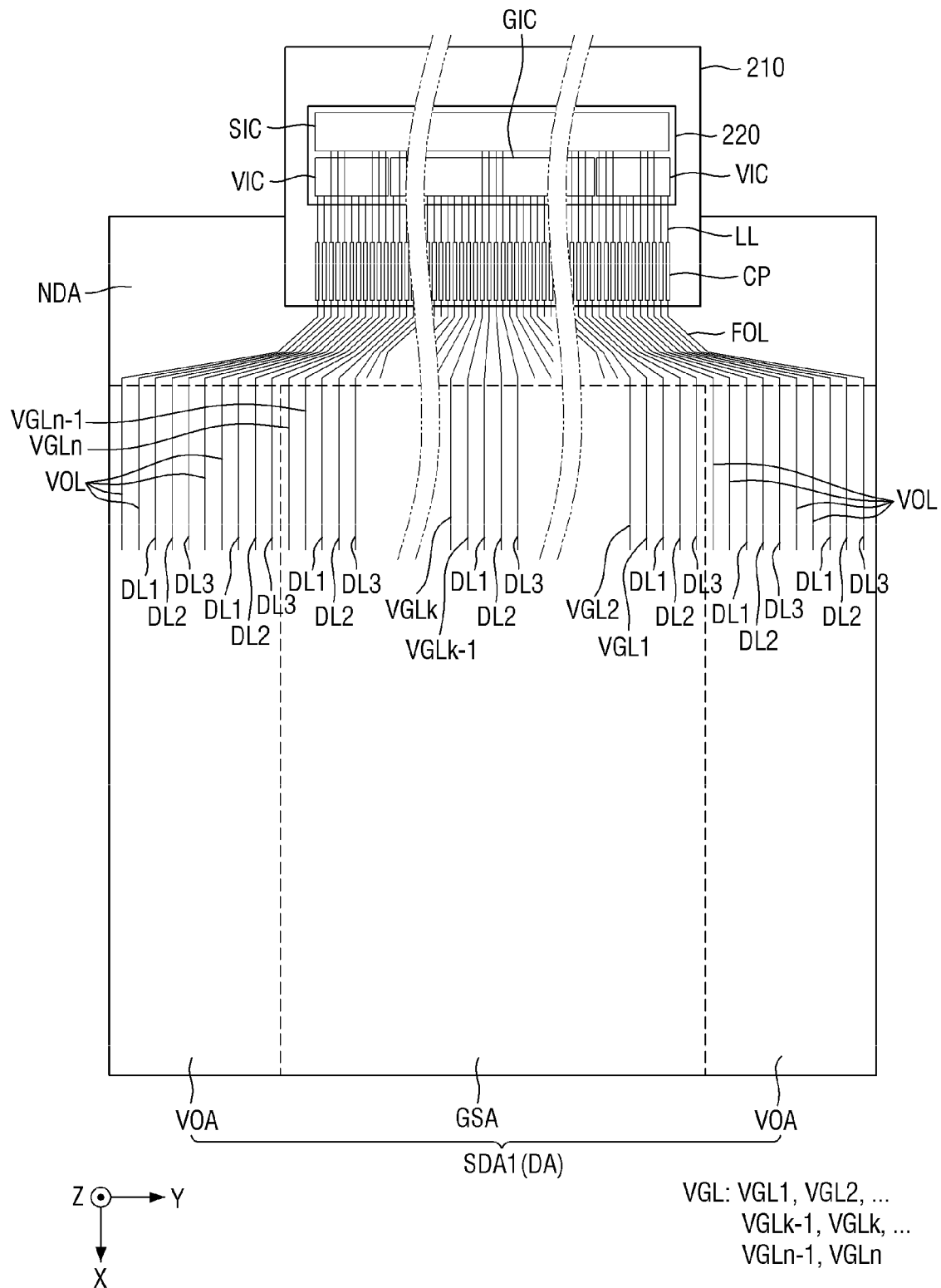
FIG. 5 is a diagram illustrating a line connection relationship between a flexible film and a display area in a tiled display device according to some embodiments.

FIG. 4 is a plan view illustrating a vertical gate area and an off voltage area in a tiled display device according to some embodiments. FIG. 5 is a diagram illustrating a line connection relationship between a flexible film and a display area in a tiled display device according to some embodiments.

Referring to FIGS. 4 and 5, the display panel 100 may include the display area DA and the non-display area NDA. The display area DA may include the first to fourth sub-display areas SDA1, SDA2, SDA3, and SDA4. The display device 10 may include four flexible films 210 and four display drivers 220. One flexible film 210 and one display driver 220 may correspond to each of the first to fourth sub-display areas SDA1, SDA2, SDA3, and SDA4. The first to fourth sub-display areas SDA1, SDA2, SDA3, and SDA4 may be arranged along the second direction (Y-axis direction), but the present disclosure is not limited thereto.

Each of the first to fourth sub-display areas SDA1, SDA2, SDA3, and SDA4 may include a vertical gate area GSA and a plurality of off voltage areas VOA.

The vertical gate area GSA may be located at the center of each of the first to fourth sub-display areas SDA1, SDA2, SDA3, and SDA4 in the second direction (Y-axis direction). The plurality of vertical gate lines VGL may be located in the vertical gate area GSA. Accordingly, the line contact portion MDC to which the vertical gate line VGL and the horizontal gate line HGL are connected may be located in the vertical gate area GSA. The plurality of line contact portions MDC may be arranged from the top of one side of the vertical gate area GSA to the bottom of the other side thereof in the first to fourth sub-display areas SDA1, SDA2, SDA3, and SDA4.

For example, in the fourth sub-display area SDA4, the plurality of line contact portions MDC may be arranged from the top right of the vertical gate area GSA to the left side thereof along a diagonal direction between the first direction (X-axis direction) and a direction that is opposite to the second direction (Y-axis direction).

Starting from the next row of the lowest line contact portion MDC of the fourth sub-display area SDA4 (e.g., starting from a row that is below a row corresponding to the lowest line contact portion MDC of the fourth sub-display area SDA4), the plurality of line contact portions MDC may be arranged from the right side of the vertical gate area GSA in the third sub-display area SDA3 to the left side thereof along the diagonal direction between the first direction (X-axis direction) and the direction opposite to the second direction (Y-axis direction).

Then, starting from the next row of the lowest line contact portion MDC of the third sub-display area SDA3 (e.g., starting from a row that is below a row corresponding to the lowest line contact portion MDC of the third sub-display area SDA3), the plurality of line contact portions MDC may be arranged from the right side of the vertical gate area GSA in the second sub-display area SDA2 to the left side thereof along the diagonal direction between the first direction (X-axis direction) and the direction opposite to the second direction (Y-axis direction).

Finally, starting from the next row of the lowest line contact portion MDC of the second sub-display area SDA2 (e.g., starting from a row that is below a row corresponding to the lowest line contact portion MDC of the second sub-display area SDA2), the plurality of line contact portions MDC may be arranged from the right side of the vertical gate area GSA in the first sub-display area SDA1 to the left side thereof (e.g., the bottom left side of the vertical gate area GSA in the first sub-display area SDA1) along the diagonal direction between the first direction (X-axis direction) and the direction opposite to the second direction (Y-axis direction).

The plurality of off voltage areas VOA may be located on both sides of the vertical gate area GSA. The off voltage areas VOA may be located adjacent to the vertical gate area GSA in the second direction (Y-axis direction), or in the direction opposite to the second direction (Y-axis direction). A plurality of off voltage lines VOL may be located in the plurality of off voltage areas VOA, but the vertical gate line VGL may not be located in the plurality of off voltage areas VOA. Accordingly, the line contact portion MDC may be omitted from the plurality of off voltage areas VOA.

The off voltage line VOL may form a constant capacitance between a pixel electrode of the pixel SP and the off voltage line VOL. Accordingly, the off voltage line VOL may reduce or prevent the effect of a kick-back voltage, and may reduce or prevent occurrence of a stain due to a luminance deviation of the plurality of pixels.

The display driver 220 may be mounted on the flexible film 210. For example, the display driver 220 may be implemented as an integrated circuit (IC). The display driver 220 may be connected to contact pads CP of the flexible film 210 through lead lines LL, and the contact pads CP of the flexible film 210 may be attached to the pad portion of the display panel 100. The pad portion of the display panel 100 may be connected to the data lines DL, the vertical gate lines VGL, and the off voltage lines VOL of the display area DA through fan-out lines FOL located in the non-display area NDA.

The display driver 220 may include a data driver SIC, a gate driver GIC, and a power driver VIC. For example, the data driver SIC, the gate driver GIC, and the power driver VIC may be implemented as a single chip and mounted on the flexible film 210, but the present disclosure is not limited thereto. Because the gate driver GIC is located on the same flexible film 210 as the data driver SIC, the width of the bonding area SM between the plurality of display devices 10 may be reduced.

The data driver SIC may receive the digital video data and the data control signal from the timing controller 240, and may convert the digital video data into the analog data voltage based on the data control signal. The converted analog data voltage may be supplied to the data lines DL located in the vertical gate area GSA and in the off voltage areas VOA through the lead lines LL and contact pads CP of the flexible film 210, and through the pad portion and fan out lines FOL of the display panel 100.

The gate driver GIC may generate the gate signal based on the gate control signal supplied from the timing controller 240, and may sequentially supply the gate signal to the plurality of vertical gate lines VGL in a set order. The gate driver GIC may be closer to the contact pads CP than the data driver SIC, but the present disclosure is not limited thereto. The gate driver GIC may be located between the plurality of power drivers VIC. The gate signal may be supplied to the vertical gate lines VGL located in the vertical gate area GSA through the lead lines LL and contact pads CP of the flexible film 210, and through the pad portion and fan out lines FOL of the display panel 100.

The power driver VIC may supply the off voltage supplied from the power supply unit 250 to the plurality of off voltage lines VOL. The off voltage may be a gate off voltage that can turn off the switching element of the pixel SP. A plurality of power drivers VIC may be located on respective sides of the gate driver GIC. The off voltage may be supplied to the off voltage lines VOL located in the off voltage areas VOA through the lead lines LL and contact pads CP of the flexible film 210, and through the pad portion and fan-out lines FOL of the display panel 100.

Figure 6:
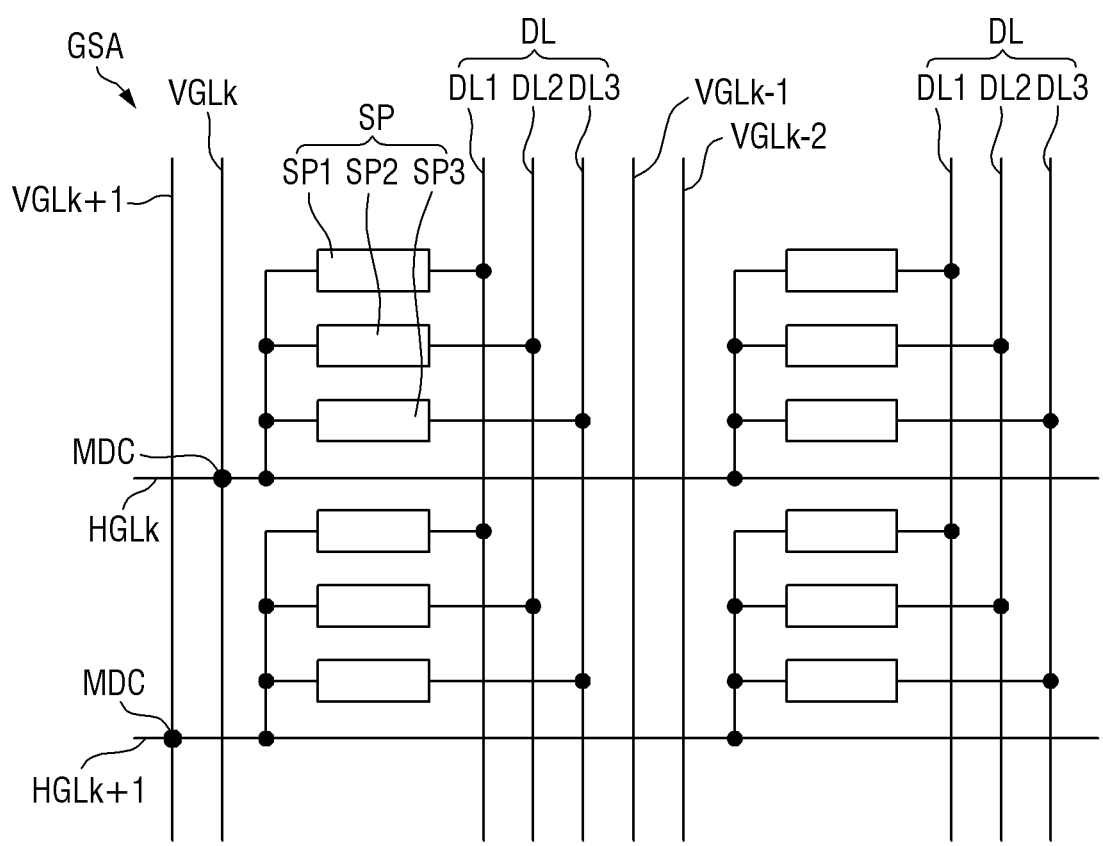
FIG. 6 is a diagram illustrating pixels in a vertical gate area in a tiled display device according to some embodiments.

FIG. 6 is a diagram illustrating pixels in a vertical gate area in a tiled display device according to some embodiments.

Referring to FIG. 6, the pixel SP located in the vertical gate area GSA may be connected to the data lines DL and to the horizontal gate line HGL. The pixel SP may be a unit pixel including the first to third sub-pixels SP1, SP2, and SP3. The first to third sub-pixels SP1, SP2, and SP3 may be sequentially and repeatedly arranged along the first direction (X-axis direction).

The first to third data lines DL1, DL2, and DL3 may extend in the first direction (X-axis direction) and may be spaced apart from each other in the second direction (Y-axis direction). The first to third sub-pixels SP1, SP2, and SP3 may receive a data voltage through the first to third data lines DL1, DL2, and DL3, respectively. Each of the first to third sub-pixels SP1, SP2, and SP3 may receive a data voltage from one data line DL, and may receive a gate signal from one horizontal gate line HGL, thereby independently expressing a gradation.

The plurality of vertical gate lines VGL may be located in parallel with the plurality of data lines DL. The plurality of horizontal gate lines HGL may cross the plurality of vertical gate lines VGL. One vertical gate line VGL may be connected to one horizontal gate line HGL through the line contact portion MDC. For example, a $k^{th}$ vertical gate line VGLk (hereinafter, k is a natural number) may be connected to a $k^{th}$ horizontal gate line HGLk, and a $(k+1)^{th}$ vertical gate line VGLk+1 may be connected to a $(k+1)^{th}$ horizontal gate line HGLk+1. The $k^{th}$ vertical gate line VGLk may be insulated from the horizontal gate lines other than the $k^{th}$ horizontal gate line HGLk among the plurality of horizontal gate lines HGL. The $k^{th}$ vertical gate line VGLk may cross the horizontal gate lines other than the $k^{th}$ horizontal gate line HGLk, but may be insulated from them by an insulating layer located between the vertical gate line VGL and the horizontal gate line HGL.

Figure 7:
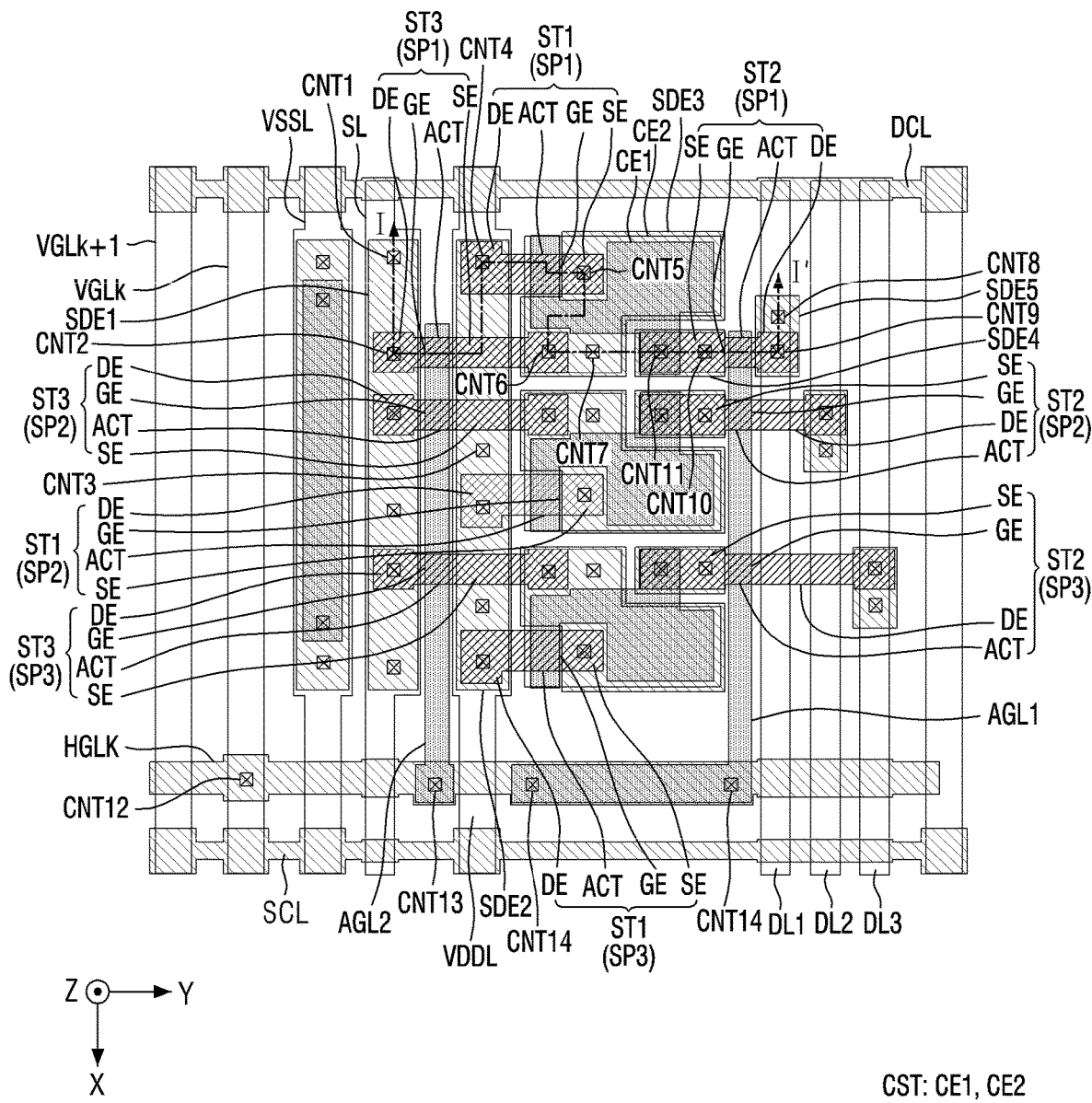
FIG. 7 is a plan view illustrating a pixel in a vertical gate area in a tiled display device according to some embodiments.
Figure 8:
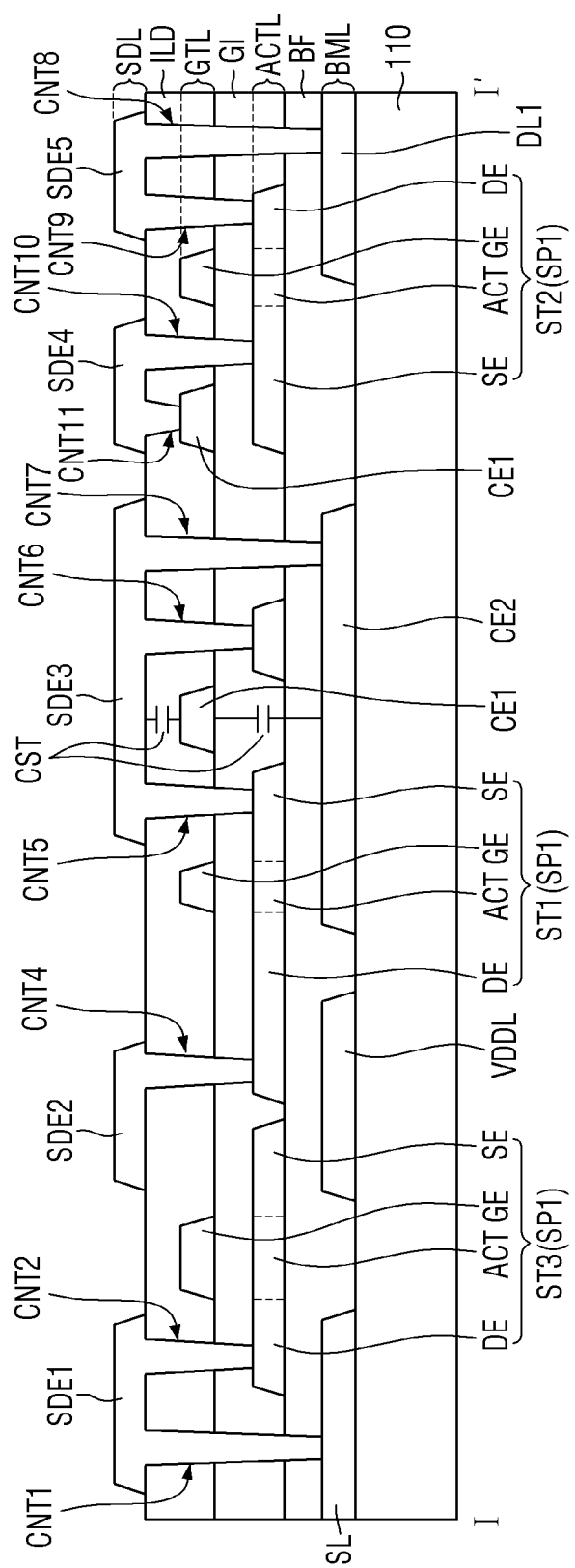
FIG. 8 is a cross-sectional view taken along the line I-I' of FIG. 7.

FIG. 7 is a plan view illustrating a pixel in a vertical gate area in a tiled display device according to some embodiments. FIG. 8 is a cross-sectional view taken along the line I-I' of FIG. 7. For example, FIG. 7 may correspond to a diagram in which a metal layer, an active layer, a gate layer, and a source-drain layer are sequentially stacked.

Referring to FIGS. 7 and 8, the pixel SP may be a unit pixel including the first to third sub-pixels SP1, SP2, and SP3. The first to third sub-pixels SP1, SP2, and SP3 may be sequentially and repeatedly arranged along the first direction (X-axis direction) in the display area DA. One unit pixel SP including the first to third sub-pixels SP1, SP2, and SP3 may be located between the high potential line VDDL and the first data line DL1.

Each of the first to third sub-pixels SP1, SP2, and SP3 may include the first to third switching elements ST1, ST2, and ST3, the storage capacitor CST, the plurality of light emitting elements EL, and the plurality of light emitting capacitors CEL. Hereinafter, a connection relationship of the first sub-pixel SP1 will be described in detail, and a connection relationship of the second sub-pixel SP2 and third sub-pixel SP3 will be omitted.

The first switching element ST1 of the first sub-pixel SP1 may include an active region ACT, a gate electrode GE, a drain electrode DE, and a source electrode SE.

The gate electrode GE of the first switching element ST1 may correspond to a region in which a first electrode CE1 of the storage capacitor CST overlaps the active region ACT of the first switching element ST1. The gate electrode GE of the first switching element ST1 or the first electrode CE1 of the storage capacitor CST may be connected to a fourth connection electrode SDE4 inserted in an eleventh contact hole CNT11. The fourth connection electrode SDE4 may be connected to a source electrode SE of the second switching element ST2 through a tenth contact hole CNT10.

The drain electrode DE of the first switching element ST1 may be connected to a second connection electrode SDE2 inserted in a fourth contact hole CNT4. The second connection electrode SDE2 may be connected to the high potential line VDDL through a third contact hole CNT3. Accordingly, the drain electrode DE of the first switching element ST1 may receive the driving voltage from the high potential line VDDL.

The source electrode SE of the first switching element ST1 may be connected to a third connection electrode SDE3 inserted in a fifth contact hole CNT5. The third connection electrode SDE3 may be connected to a source electrode SE of the third switching element ST3 through a sixth contact hole CNT6, and to a second electrode CE2 of the storage capacitor CST through a seventh contact hole CNT7. The third connection electrode SDE3 may be connected to the second electrode CE2 of the storage capacitor CST and may overlap the first electrode CE1 of the storage capacitor CST in the thickness direction. Accordingly, the storage capacitor CST may be additionally formed between the third connection electrode SDE3 and the first electrode CE1 of the storage capacitor CST.

A gate electrode GE of the second switching element ST2 in the first sub-pixel SP1 may correspond to a region in which a first auxiliary gate line AGL1 overlaps an active region ACT of the second switching element ST2. The first auxiliary gate line AGL1 may be connected to the $k^{th}$ horizontal gate line HGLk inserted in a fourteenth contact hole CNT14 and may receive a gate signal from the $k^{th}$ horizontal gate line HGLk.

A drain electrode DE of the second switching element ST2 may be connected to a fifth connection electrode SDE5 inserted in a ninth contact hole CNT9. The fifth connection electrode SDE5 may be connected to the first data line DL1 through an eighth contact hole CNT8. Accordingly, the drain electrode DE of the second switching element ST2 may receive a data voltage from the first data line DL1.

The source electrode SE of the second switching element ST2 may be connected to the fourth connection electrode SDE4 inserted in the tenth contact hole CNT10. The fourth connection electrode SDE4 may be connected to the first electrode CE1 of the storage capacitor CST or the gate electrode GE of the first switching element ST1 through the eleventh contact hole CNT11.

A gate electrode GE of the third switching element ST3 in the first sub-pixel SP1 may correspond to a region in which a second auxiliary gate line AGL2 overlaps an active region ACT of the third switching element ST3. The second auxiliary gate line AGL2 may be connected to the $k^{th}$ horizontal gate line HGLk inserted in a thirteenth contact hole CNT13 and may receive the gate signal from the $k^{th}$ horizontal gate line HGLk.

A drain electrode DE of the third switching element ST3 may be connected to a first connection electrode SDE1 inserted in a second contact hole CNT2. The first connection electrode SDE1 may be connected to the sensing line SL through a first contact hole CNT1. Accordingly, the drain electrode DE of the third switching element ST3 may receive an initialization voltage from the sensing line SL.

The source electrode SE of the third switching element ST3 may be connected to the third connection electrode SDE3 inserted in the sixth contact hole CNT6. The third connection electrode SDE3 may be connected to the source electrode SE of the first switching element ST1 through the fifth contact hole CNT5, and to the second electrode CE2 of the storage capacitor CST through the seventh contact hole CNT7.

The first data line DL1 may be located on the right side of the first to third sub-pixels SP1, SP2, and SP3. The second data line DL2 may be located on the right side of the first data line DL1, and the third data line DL3 may be located on the right side of the second data line DL2. The first to third data lines DL1, DL2, and DL3 may extend in the first direction (X-axis direction) and may be spaced apart from each other in the second direction (Y-axis direction). Each of the first to third data lines DL1, DL2, and DL3 may be connected to the drain electrode DE of the second switching element ST2 of each of the first to third sub-pixels SP1, SP2, and SP3.

The high potential line VDDL may be located on the left side of the first to third sub-pixels SP1, SP2, and SP3. The high potential line VDDL may extend in the first direction (X-axis direction). The high potential line VDDL may be connected to the second connection electrode SDE2 inserted in the third contact hole CNT3. The second connection electrode SDE2 may be connected to the drain electrode DE of the first switching element ST1 through the fourth contact hole CNT4.

The sensing line SL may be located on the left side of the high potential line VDDL. The sensing line SL may extend in the first direction (X-axis direction). The sensing line SL may be connected to the first connection electrode SDE1 inserted in the first contact hole CNT1. The first connection electrode SDE1 may be connected to the drain electrode DE of the third switching element ST3 through the second contact hole CNT2.

The low potential line VSSL may be located on the left side of the sensing line SL. The low potential line VSSL may extend in the first direction (X-axis direction). The low potential line VSSL may supply a low potential voltage or a common voltage to the second electrode of the second light emitting element EL2 of each of the first to third sub-pixels SP1, SP2, and SP3.

The $k^{th}$ vertical gate line VGLk may be located on the left side of the low potential line VSSL. The $k^{th}$ vertical gate line VGLk may extend in the first direction (X-axis direction). The $k^{th}$ vertical gate line VGLk may be connected to the $k^{th}$ horizontal gate line HGLk inserted in a twelfth contact hole CNT12. Here, the twelfth contact hole CNT12 may correspond to the line contact portion MDC to which the vertical gate line VGL and the horizontal gate line HGL are connected. The $k^{th}$ vertical gate line VGLk may supply the gate signal received from the gate driver GIC to $k^{th}$ horizontal gate line HGLk.

The $k^{th}$ horizontal gate line HGLk may extend in the second direction (Y-axis direction). The $k^{th}$ horizontal gate line HGLk may be connected to the $k^{th}$ vertical gate line VGLk through the twelfth contact hole CNT12. The $k^{th}$ horizontal gate line HGLk may be connected to the second auxiliary gate line AGL2 through the thirteenth contact hole CNT13, and to the first auxiliary gate line AGL1 through the fourteenth contact hole CNT14. Accordingly, the $k^{th}$ horizontal gate line HGLk may supply the gate signal received from the $k^{th}$ vertical gate line VGLk to the first and second auxiliary gate lines AGL1 and AGL2.

The first auxiliary gate line AGL1 may extend in a direction that is opposite to the first direction (X-axis direction) from the horizontal gate line HGL. The first auxiliary gate line AGL1 may be located between the pixel SP and the first data line DL1. A region in which the first auxiliary gate line AGL1 overlaps the active region ACT of the second switching element ST2 may correspond to the gate electrode GE of the second switching element ST2.

The second auxiliary gate line AGL2 may extend in the direction that is opposite to the first direction (X-axis direction) from the horizontal gate line HGL. The second auxiliary gate line AGL2 may be located between the sensing line SL and the high potential line VDDL. A region in which the second auxiliary gate line AGL2 overlaps the active region ACT of the third switching element ST3 may correspond to the gate electrode GE of the third switching element ST3.

The $(k+1)^{th}$ vertical gate line VGLk+1 may be located on the left side of the $k^{th}$ vertical gate line VGLk. The $(k+1)^{th}$ vertical gate line VGLk+1 may extend in the first direction (X-axis direction). In FIG. 6, the $(k+1)^{th}$ vertical gate line VGLk+1 may be connected to the $(k+1)^{th}$ horizontal gate line HGLk+1 through the line contact portion MDC. The $(k+1)^{th}$ vertical gate line VGLk+1 may supply the gate signal received from the gate driver GIC to the $(k+1)^{th}$ horizontal gate line HGLk+1.

A high potential connection line DCL may extend in the second direction (Y-axis direction). The high potential connection line DCL may be located on the upper side of the first sub-pixel SP1. The high potential connection line DCL may be connected to the high potential line VDDL.

The low potential connection line SCL may extend in the second direction (Y-axis direction). The low potential connection line SCL may be located on the lower side of the $k^{th}$ horizontal gate line HGLk. The low potential connection line SCL may be connected to the low potential line VSSL.

In FIG. 8, the display panel 100 may include a substrate 110, a metal layer BML, a buffer layer BF, an active layer ACTL, a gate insulating layer GI, a gate layer GTL, an interlayer insulating layer ILD, and a source-drain layer SDL.

The substrate 110 may be a base substrate or a base member, and may be made of an insulating material such as a polymer resin. For example, the substrate 110 may be a rigid substrate. When the substrate 110 is a rigid substrate, the substrate 110 may include a glass material or a metal material, but the present disclosure is not limited thereto. In another example, the substrate 110 may be a flexible substrate which can be bent, folded, and/or rolled. When the substrate 110 is a flexible substrate, the substrate 110 may include polyimide (PI), but the present disclosure is not limited thereto.

The metal layer BML may be located on the substrate 110. The metal layer BML may include the first to third data lines DL1, DL2, and DL3, the second electrode CE2 of the storage capacitor CST, the high potential line VDDL, the sensing line SL, the low potential line VSSL, the $k^{th}$ vertical gate line VGLk, and the $(k+1)^{th}$ vertical gate line VGLk+1. The metal layer BML may include a light blocking material capable of blocking light incident on the plurality of pixels SP.

The buffer layer BF may be located on the substrate 110 to cover the metal layer BML. For example, the buffer layer BF may include a plurality of inorganic layers, and may be formed on the entire top surface of the substrate 110 to reduce or prevent the permeation of moisture into the light emitting elements EL through the substrate 110.

The active layer ACTL may be located on the buffer layer BF. The active layer ACTL may include a silicon-based material, but the present disclosure is not limited thereto. For example, the active layer ACTL may be formed of low temperature polycrystalline silicon (LTPS). The active region ACT, the drain electrode DE, and the source electrode SE of each of the first to third switching elements ST1, ST2, and ST3 may be part of the active layer ACTL.

The gate insulating layer GI may cover the buffer layer BF and the active layer ACTL, and may insulate the active layer ACTL from the gate layer GTL.

The gate layer GTL may be located on the gate insulating layer GI. The gate layer GTL may include the gate electrode GE of each of the first to third switching elements ST1, ST2, and ST3 and the first and second auxiliary gate lines AGL1 and AGL2.

The interlayer insulating layer ILD may cover the gate layer GTL and the gate insulating layer GI. The interlayer insulating layer ILD may insulate the gate layer GTL from the source-drain layer SDL.

The source-drain layer SDL may be located on the interlayer insulating layer ILD. The source-drain layer SDL may include the first to fifth connection electrodes SDE1, SDE2, SDE3, SDE4, and SDE5.

Figure 9:
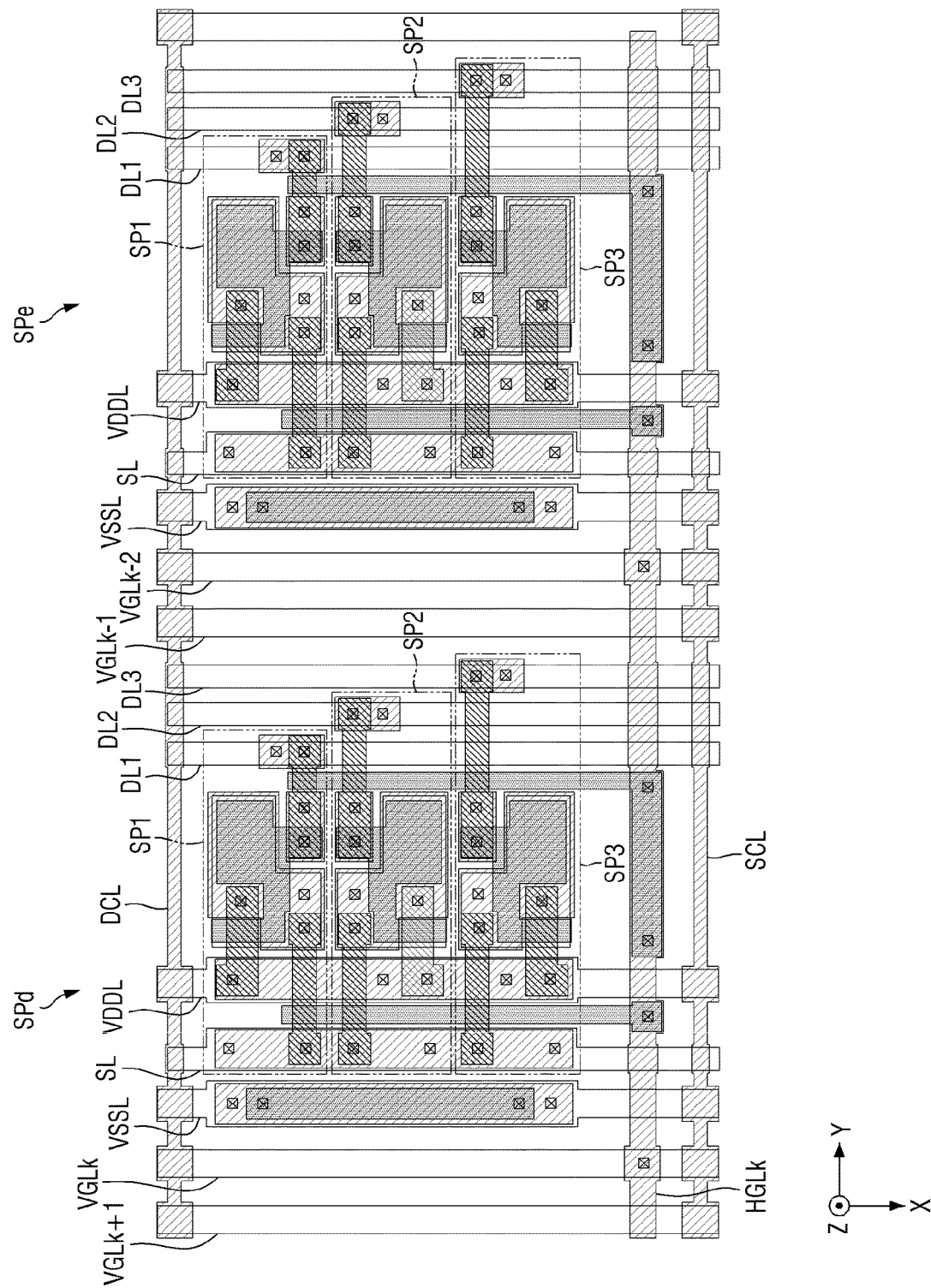
FIG. 9 is a plan view illustrating a plurality of pixels in a vertical gate area in a tiled display device according to some embodiments.

FIG. 9 is a plan view illustrating a plurality of pixels in a vertical gate area in a tiled display device according to some embodiments.

Referring to FIG. 9, the vertical gate area GSA may include a fourth pixel SPd and a fifth pixel SPe located adjacent to each other in the second direction (Y-axis direction). Each of the fourth and fifth pixels SPd and SPe may include the first to third sub-pixels SP1, SP2, and SP3 arranged along the first direction (X-axis direction).

The high potential line VDDL, the sensing line SL, and the low potential line VSSL may extend in the first direction (X-axis direction) and may be located on the left side of the fifth pixel SPe. For example, the high potential line VDDL may be located on the left side of the fifth pixel SPe, the sensing line SL may be located on the left side of the high potential line VDDL, and the low potential line VSSL may be located on the left side of the sensing line SL.

A $(k-2)^{th}$ vertical gate line VGLk-2 may extend in the first direction (X-axis direction) and may be located on the left side of the low potential line VSSL provided on the left side of the fifth pixel SPe. The $(k-2)^{th}$ vertical gate line VGLk-2 may be insulated from the $k^{th}$ horizontal gate line HGLk.

A $(k-1)^{th}$ vertical gate line VGLk-1 may extend in the first direction (X-axis direction) and may be located on the left side of the $(k-2)^{th}$ vertical gate line VGLk-2. The $(k-1)^{th}$ vertical gate line VGLk-1 may be insulated from the $k^{th}$ horizontal gate line HGLk.

The first to third data lines DL1, DL2, and DL3 may extend in the first direction (X-axis direction) and may be located on the right side of the fourth pixel SPd. The first to third data lines DL1, DL2, and DL3 may be connected to the first to third sub-pixels SP1, SP2, and SP3 of the fourth pixel SPd, respectively.

The high potential line VDDL, the sensing line SL, and the low potential line VSSL may extend in the first direction (X-axis direction) and may be located on the left side of the fourth pixel SPd. For example, the high potential line VDDL may be located on the left side of the fourth pixel SPd, the sensing line SL may be located on the left side of the high potential line VDDL, and the low potential line VSSL may be located on the left side of the sensing line SL.

The $k^{th}$ vertical gate line VGLk may extend in the first direction (X-axis direction) and may be located on the left side of the low potential line VSSL provided on the left side of the fourth pixel SPd. The $k^{th}$ vertical gate line VGLk may be connected to the $k^{th}$ horizontal gate line HGLk through the line contact portion MDC.

The $(k+1)^{th}$ vertical gate line VGLk+1 may extend in the first direction (X-axis direction) and may be located on the left side of the $k^{th}$ vertical gate line VGLk. The $(k+1)^{th}$ vertical gate line VGLk+1 may be insulated from the $k^{th}$ horizontal gate line HGLk.

In this way, the $(k-2)^{th}$ vertical gate line VGLk-2 and the $(k-1)^{th}$ vertical gate line VGLk-1 in the vertical gate area GSA may be located between the fourth pixel SPd and the fifth pixel SPe. The $(k-2)^{th}$ vertical gate line VGLk-2 and the $(k-1)^{th}$ vertical gate line VGLk-1 may be located between the low potential line VSSL located on the left side of the fifth pixel SPe and the data lines DL located on the right side of the fourth pixel SPd. The $(k-2)^{th}$ vertical gate line VGLk-2 and the $(k-1)^{th}$ vertical gate line VGLk-1 may be located between the high potential line VDDL located on the left side of the fifth pixel SPe and the data lines DL located on the right side of the fourth pixel SPd.

Figure 10:
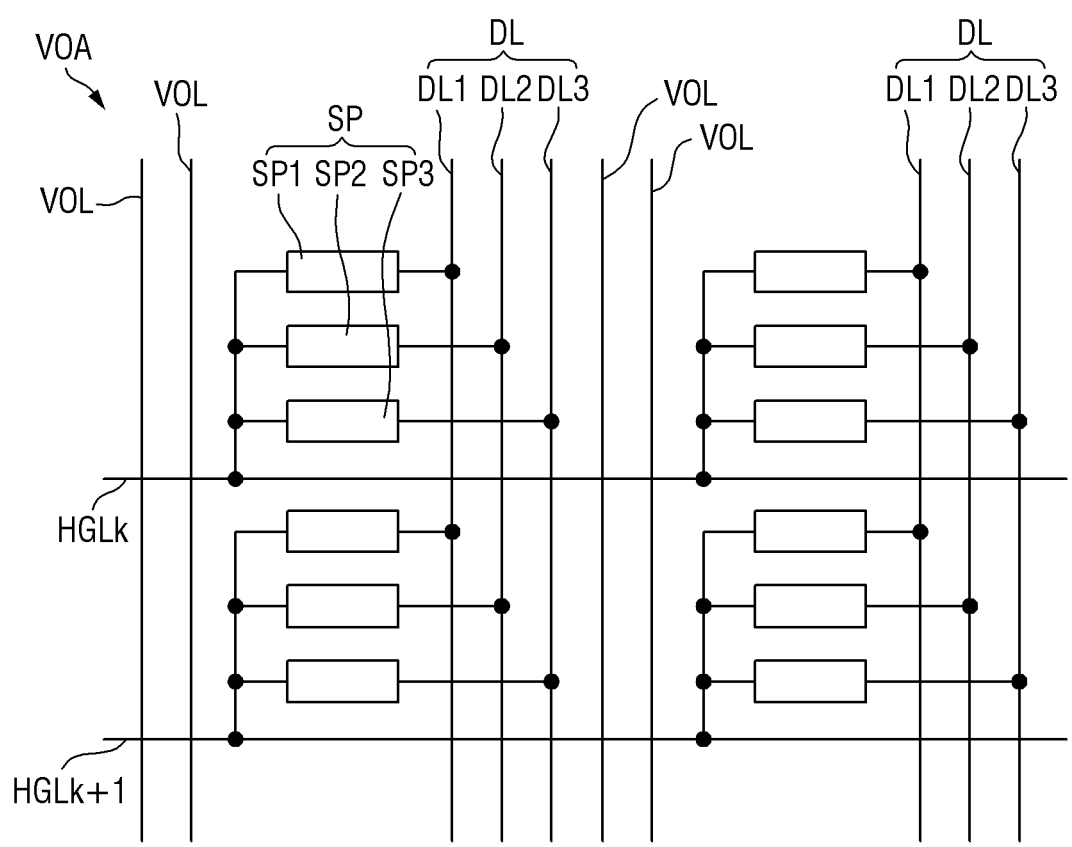
FIG. 10 is a diagram illustrating a pixel in an off voltage area in a tiled display device according to some embodiments.
Figure 11:
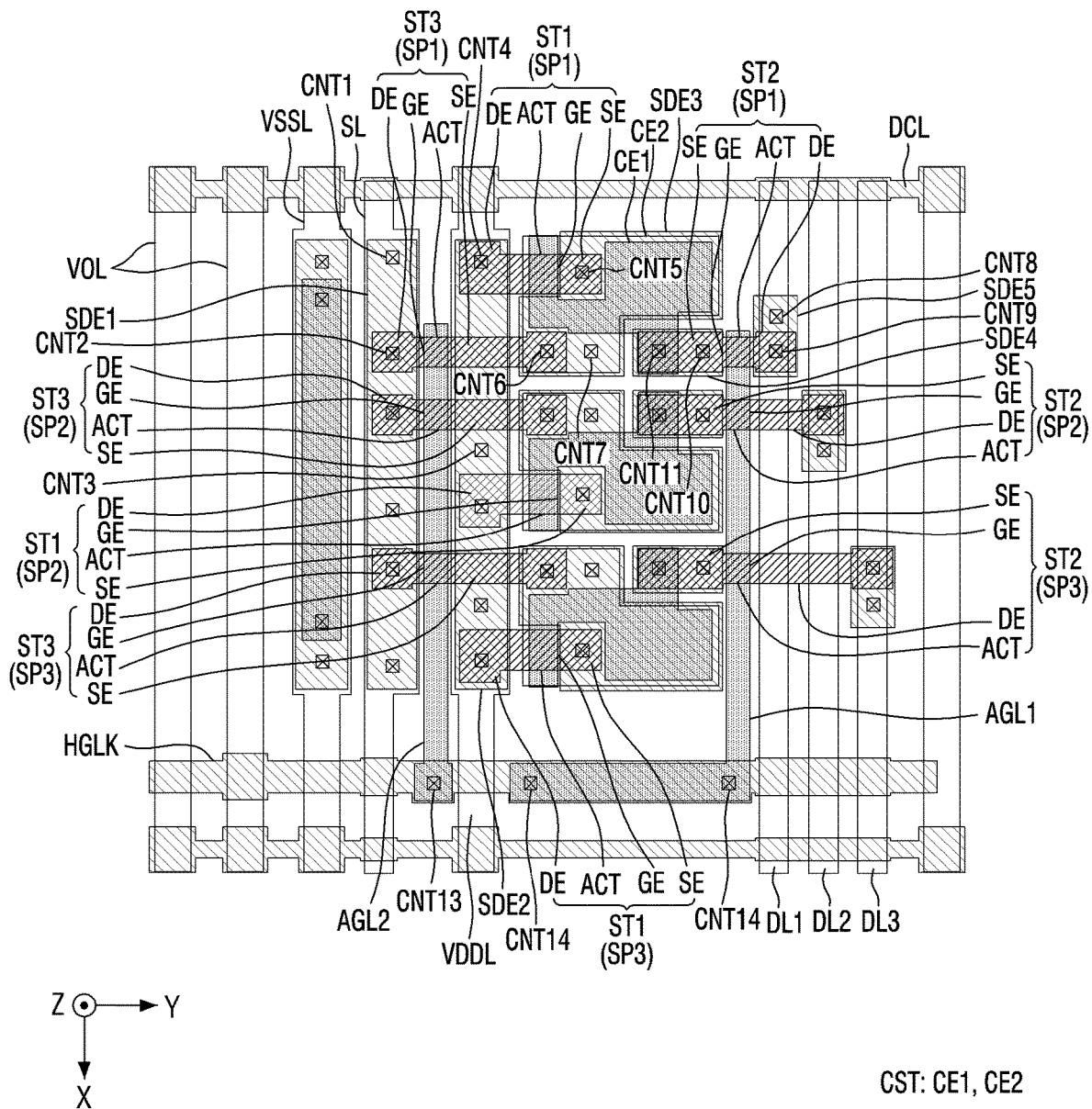
FIG. 11 is a plan view illustrating a pixel in an off voltage area in a tile display device according to some embodiments.

FIG. 10 is a diagram illustrating a pixel in an off voltage area in a tiled display device according to some embodiments. FIG. 11 is a plan view illustrating a pixel in an off voltage area in a tile display device according to some embodiments. The off voltage area VOA shown in FIGS. 10 and 11 includes the off voltage line VOL without including the vertical gate line VGL located in the vertical gate area GSA shown in FIGS. 6 and 7. The same configuration as the above-described configuration will be briefly described or omitted.

Referring to FIGS. 10 and 11, the pixel SP located in the off voltage area VOA may be connected to the data lines DL and the horizontal gate line HGL. The horizontal gate line HGL of the vertical gate area GSA connected to the line contact portion MDC of the vertical gate area GSA may extend to the off voltage area VOA. The pixel SP may be a unit pixel including the first to third sub-pixels SP1, SP2, and SP3. The first to third sub-pixels SP1, SP2, and SP3 may be sequentially and repeatedly arranged along the first direction (X-axis direction).

The first to third data lines DL1, DL2, and DL3 may extend in the first direction (X-axis direction) and may be located on the right side of the pixel SP. The first to third data lines DL1, DL2, and DL3 may be connected to the first to third sub-pixels SP1, SP2, and SP3, respectively.

The high potential line VDDL, the sensing line SL, and the low potential line VSSL may extend in the first direction (X-axis direction) and may be located on the left side of the pixel SP. For example, the high potential line VDDL may be located on the left side of the pixel SP, the sensing line SL may be located on the left side of the high potential line VDDL, and the low potential line VSSL may be located on the left side of the sensing line SL.

The at least one off voltage line VOL may extend in the first direction (X-axis direction) and may be located on the left side of the low potential line VSSL provided on the left side of the pixel SP. The off voltage line VOL may have an off voltage supplied from the power driver VIC. The vertical gate line VGL may not be located in the off voltage area VOA.

Figure 12:
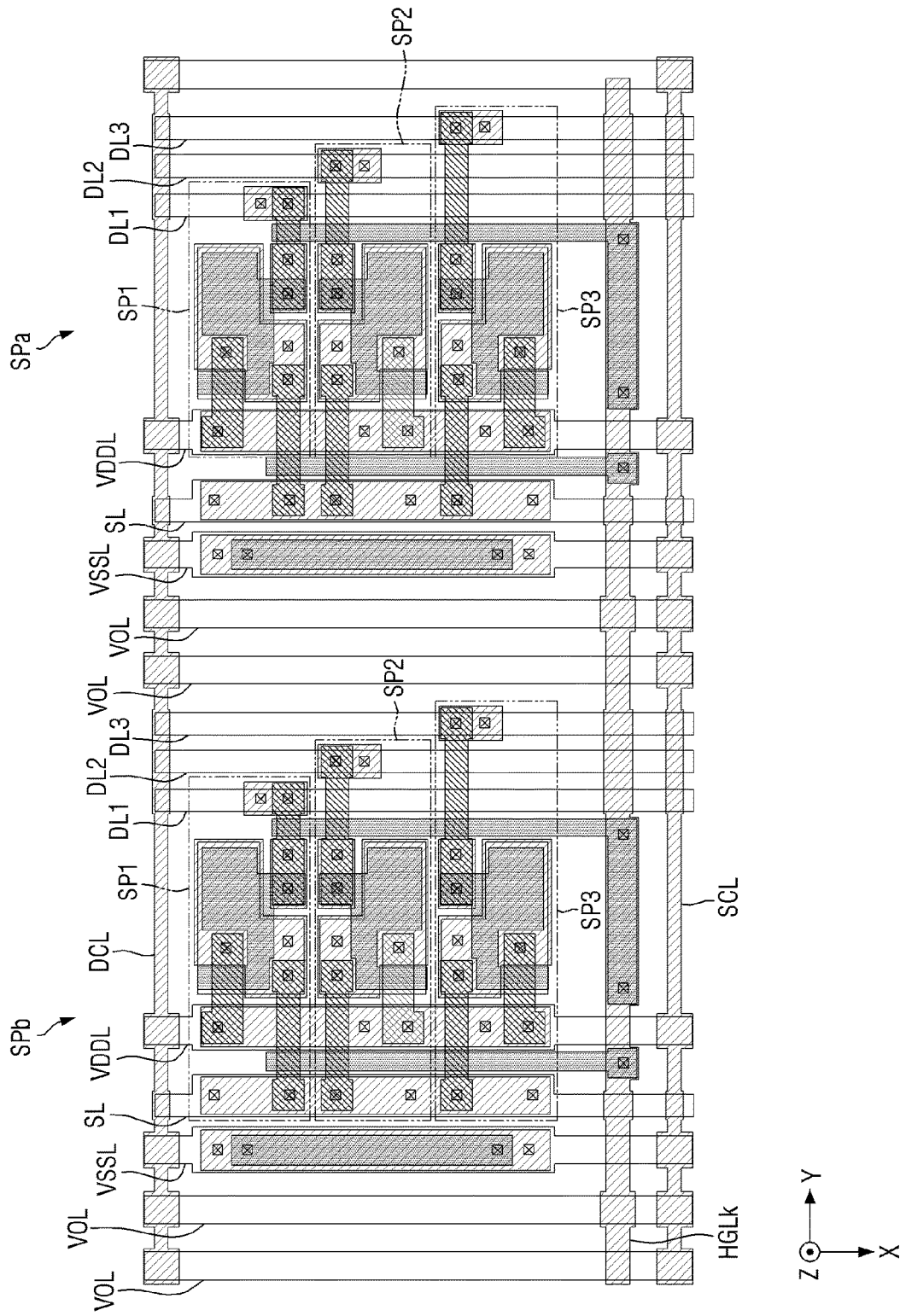
FIG. 12 is a plan view illustrating a plurality of pixels in an off voltage area in a tiled display device according to some embodiments.

FIG. 12 is a plan view illustrating a plurality of pixels in an off voltage area in a tiled display device according to some embodiments.

Referring to FIG. 12, the off voltage area VOA may include a first pixel SPa and a second pixel SPb located adjacent to each other in the second direction (Y-axis direction). Each of the first and second pixels SPa and SPb may include the first to third sub-pixels SP1, SP2, and SP3 arranged along the first direction (X-axis direction). For example, when the first pixel SPa is located at the outermost side of the first display device 10-1, the second pixel SPb may be located more inward than first pixel SPa.

The high potential line VDDL, the sensing line SL, and the low potential line VSSL may extend in the first direction (X-axis direction) and may be located on the left side of the first pixel SPa. For example, the high potential line VDDL may be located on the left side of the first pixel SPa, the sensing line SL may be located on the left side of the high potential line VDDL, and the low potential line VSSL may be located on the left side of the sensing line SL.

At least one off voltage line VOL may extend in the first direction (X-axis direction) and may be located on the left side of the low potential line VSSL provided on the left side of the first pixel SPa. The at least one off voltage line VOL may be insulated from the $k^{th}$ horizontal gate line HGLk.

The first to third data lines DL1, DL2, and DL3 may extend in the first direction (X-axis direction) and may be located on the right side of the second pixel SPb. The first to third data lines DL1, DL2, and DL3 may be connected to the first to third sub-pixels SP1, SP2, and SP3 of the second pixel SPb, respectively.

The high potential line VDDL, the sensing line SL, and the low potential line VSSL may extend in the first direction (X-axis direction) and may be located on the left side of the second pixel SPb. For example, the high potential line VDDL may be located on the left side of the second pixel SPb, the sensing line SL may be located on the left side of the high potential line VDDL, and the low potential line VSSL may be located on the left side of the sensing line SL.

The at least one off voltage line VOL may extend in the first direction (X-axis direction) and may be located on the left side of the low potential line VSSL provided on the left side of the second pixel SPb.

As such, in the off voltage area VOA, the at least one off voltage line VOL may be located between the second pixel SPb and the first pixel SPa. The at least one off voltage line VOL may be located between the low potential line VSSL provided on the left side of the first pixel SPa and the data lines DL provided on the right side of the second pixel SPb. The at least one off voltage line VOL may be located between the high potential line VDDL provided on the left side of the first pixel SPa and the data lines DL provided on the right side of the second pixel SPb.

Accordingly, the distance between the fourth pixel SPd and the fifth pixel SPe in the vertical gate area GSA may be substantially the same as the distance between the second pixel SPb and the first pixel SPa in the off voltage area VOA.

Figure 13:
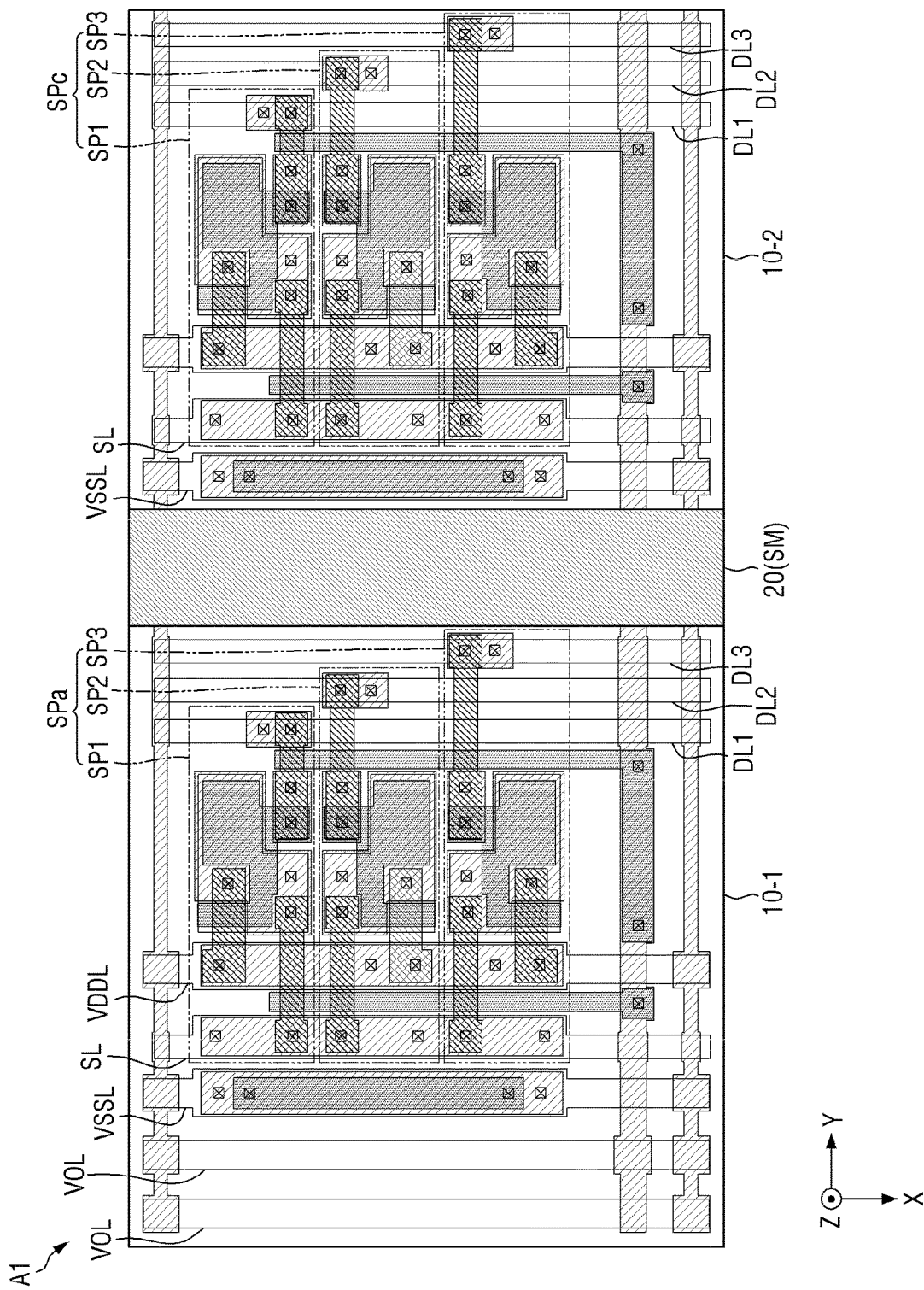
FIG. 13 is an enlarged view of area A1 of FIG. 1.

FIG. 13 is an enlarged view of area A1 of FIG. 1.

Referring to FIG. 13, in the tiled display device TD, the side surfaces of adjacent display devices 10 may be bonded to each other by using a bonding member located between the plurality of display devices 10. The bonding member 20 may connect the respective side surfaces of the first to fourth display devices 10-1 to 10-4 arranged in a grid form to implement the tiled display device TD.

For example, the bonding member 20 may be made of an adhesive or a double-sided tape having a relatively thin thickness to reduce or minimize the width of the bonding area SM. As another example, the bonding member 20 may be formed of a bonding frame having a relatively thin thickness to reduce or minimize the width of the bonding area SM. Accordingly, in the tiled display device TD, it is possible to reduce or prevent recognition, by the user, of the bonding area SM between the plurality of display devices 10.

The first display device 10-1 may include the first pixel SPa located at the outermost side of the first display device 10-1 adjacent to the second display device 10-2.

The first to third data lines DL1, DL2, and DL3 may extend in the first direction (X-axis direction) and may be located on the right side of the first pixel SPa. The first to third data lines DL1, DL2, and DL3 may be connected to the first to third sub-pixels SP1, SP2, and SP3 of the first pixel SPa, respectively.

The data lines DL connected to the first pixel SPa located at the outermost side of the first display device 10-1 may be located adjacent to the bonding area SM. For example, the third data line DL3 connected to the first pixel SPa may directly face one side of the bonding area SM or the bonding member 20. The first to third data lines DL1, DL2, and DL3 may be located between the first pixel SPa and the bonding area SM.

The high potential line VDDL, the sensing line SL, and the low potential line VSSL may extend in the first direction (X-axis direction) and may be located on the left side of the first pixel SPa. For example, the high potential line VDDL may be located on the left side of the first pixel SPa, the sensing line SL may be located on the left side of the high potential line VDDL, and the low potential line VSSL may be located on the left side of the sensing line SL.

At least one off voltage line VOL may extend in the first direction (X-axis direction) and may be located on the left side of the low potential line VSSL provided on the left side of the first pixel SPa. The at least one off voltage line VOL may be insulated from the $k^{th}$ horizontal gate line HGLk.

The second display device 10-2 may include a third pixel SPc located at the outermost side of the second display device 10-2 adjacent to the first display device 10-1.

The first to third data lines DL1, DL2, and DL3 may extend in the first direction (X-axis direction) and may be located on the right side of the third pixel SPc. The first to third data lines DL1, DL2, and DL3 may be connected to the first to third sub-pixels SP1, SP2, and SP3 of the third pixel SPc, respectively.

The high potential line VDDL, the sensing line SL, and the low potential line VSSL may extend in the first direction (X-axis direction) and may be located on the left side of the third pixel SPc. For example, the high potential line VDDL may be located on the left side of the third pixel SPc, the sensing line SL may be located on the left side of the high potential line VDDL, and the low potential line VSSL may be located on the left side of the sensing line SL.

The high potential line VDDL or the sensing line SL connected to the third pixel SPc located at the outermost side of the second display device 10-2 may be located adjacent to the bonding area SM. In some embodiments, the low potential line VSSL located on the left side of the sensing line SL may be located adjacent to the bonding area SM. For example, the low potential line VSSL located on the left side of the third pixel SPc may directly face the other side of the bonding area SM or the bonding member 20. The high potential line VDDL, the sensing line SL, and the low potential line VSSL may be located between the bonding area SM and the third pixel SPc. Accordingly, the off voltage line VOL or the vertical gate line VGL might not be located between the first pixel SPa of the first display device 10-1 and the third pixel SPc of the second display device 10-2.

The distance between the first pixel SPa of the first display device 10-1 and the third pixel SPc of the second display device 10-2 may be substantially the same as the distance between the fourth pixel SPd and the fifth pixel SPe in the vertical gate area GSA. The distance between the first pixel SPa of the first display device 10-1 and the third pixel SPc of the second display device 10-2 may be substantially the same as the distance between the second pixel SPb and the first pixel SPa in the off voltage area VOA. Accordingly, the distance between the display areas DA of the plurality of display devices 10 may be sufficiently close such that the bonding area SM is not recognized by the user. The reflectance of external light of the display areas DA of the plurality of display devices 10 may be substantially the same as that of the bonding area SM. Accordingly, in the tiled display device TD, recognition of the bonding area SM by the user may be reduced or prevented, thereby removing a sense of disconnection between the plurality of display devices 10, and thereby improving a sense of immersion in an image.

What is claimed is:

1. A tiled display device comprising adjacent first and second display devices comprising:
    a display area having pixels;
    a bonding area between the display areas of the first and second display devices;
    data lines extending in a first direction;
    first gate lines extending in the first direction, and configured to transmit a gate signal; and
    off voltage lines extending in the first direction, and configured to transmit an off voltage,
    wherein one of the off voltage lines is between a first pixel at an outermost side of the first display device and a second pixel located more inwardly than first pixel, and
    wherein the off voltage lines are not between a third pixel at an outermost side of the second display device and the first pixel.

2. The tiled display device of claim 1, wherein the bonding area is between the first pixel and the third pixel.

3. The tiled display device of claim 1, wherein one of the data lines is between the first pixel and the bonding area.

4. The tiled display device of claim 1, wherein the display area comprises:
   a vertical gate area in which the first gate lines are located; and
   off voltage areas on respective sides of the vertical gate area, and in which the off voltage lines are located.

5. The tiled display device of claim 4, wherein each of the first and second display devices further comprises second gate lines extending in a second direction crossing the first direction, and
   wherein the vertical gate area comprises line contact portions to which respective ones of the first gate lines and the second gate lines are connected.

6. The tiled display device of claim 5, wherein each of the first and second display devices further comprises a first auxiliary gate line extending in a direction opposite to the first direction from the second gate lines,
   wherein the first auxiliary gate line of the first display device is between the first pixel and one of the data lines adjacent to the first pixel in the second direction, and
   wherein the first auxiliary gate line of the second display device is between the third pixel and one of the data lines adjacent to the third pixel in the second direction.

7. The tiled display device of claim 5, wherein each of the first and second display devices further comprises a second auxiliary gate line extending in a direction opposite to the first direction from a respective one of the second gate lines, and located between a high potential line configured to transmit a high potential voltage, and a sensing line connected to the first pixel or to the third pixel.

8. The tiled display device of claim 4, wherein one of the first gate lines is between one of the data lines connected to a fourth pixel in the vertical gate area, and a high potential line configured to transmit a high potential voltage and connected to a fifth pixel adjacent to the fourth pixel.

9. The tiled display device of claim 1, wherein the first and second display devices comprises:
   a flexible film in a non-display area on one side of the display area; and
   a display driver on the flexible film.

10. The tiled display device of claim 9, wherein one side of the display area facing the flexible film is either perpendicular to, or opposite to, another side of the display area facing the bonding area.

11. The tiled display device of claim 9, wherein the display driver comprises:
    a data driver configured to supply a data voltage to the data lines;
    a gate driver configured to supply a gate signal to the first gate lines; and
    an off voltage supply unit configured to supply an off voltage to the off voltage lines.

12. The tiled display device of claim 1, wherein the first and second display devices further comprises:
    a high potential line extending in the first direction, and configured to transmit a high potential voltage;
    a low potential line extending in the first direction, and configured to transmit a low potential voltage; and
    a sensing line extending in the first direction and connected to one of the pixels.

13. The tiled display device of claim 12, wherein at least one of the high potential line, the low potential line, and the sensing line is between the bonding area and the third pixel.

14. The tiled display device of claim 12, wherein the first and third pixels comprises:
    a first sub-pixel;
    a second sub-pixel adjacent to the first sub-pixel in the first direction; and
    a third sub-pixel adjacent to the second sub-pixel in the first direction.

15. The tiled display device of claim 14, wherein the data lines comprise:
    a first data line adjacent to the first to third sub-pixels in a second direction crossing the first direction, and connected to the first sub-pixel;
    a second data line adjacent to the first data line in the second direction, and connected to the second sub-pixel; and
    a third data line adjacent to the second data line in the second direction, and connected to the third sub-pixel.

16. The tiled display device of claim 15, wherein the high potential line is adjacent to the first to third sub-pixels in a direction opposite to the second direction,
    wherein the sensing line is adjacent to the high potential line in the direction opposite to the second direction, and
    wherein the low potential line is adjacent to the sensing line in the direction opposite to the second direction.

17. The tiled display device of claim 15, wherein the third data line of the first pixel directly faces the bonding area.

18. The tiled display device of claim 17, wherein the low potential line is located in a direction opposite to the second direction from the third pixel, and directly faces a side of the display area that is opposite to the bonding area.

19. A tiled display device comprising a first display device comprising a first display area having pixels, a second display device on one side of the first display device and comprising a second display area having pixels, and a bonding area between the first display area and the second display area,
    wherein each of the first and second display devices comprises:
       a data line extending in a first direction, and adjacent to one of the pixels in a second direction crossing the first direction; and
       a low potential line extending in the first direction, and adjacent to the one of the pixels in a direction that is opposite to the second direction,
    wherein the first display device comprises a first pixel of the pixels that is closest to the bonding area, and an off voltage line extending in the first direction and located in a direction opposite to the second direction from the first pixel, and
    wherein the second display device comprises a second pixel of the pixels that is closest to the bonding area, and the low potential line, which is located in a direction that is opposite to the second direction from the second pixel, and which directly faces the bonding area.

20. The tiled display device of claim 19, wherein the data line, which is located in the second direction from the first pixel, directly faces a side of the first display area that is opposite to the bonding area.

* * * * *